(12) United States Patent
    Beckhoff

(10) Patent No.: US 11,490,538 B2
(45) Date of Patent: Nov. 1, 2022

(54) CONTROL-CABINET SYSTEM WITH BASE MODULE AND FUNCTIONAL MODULE, AS WELL AS FUNCTIONAL MODULE

(71) Applicant: Beckhoff Automation GmbH, Verl (DE)

(72) Inventor: Hans Beckhoff, Verl (DE)

(73) Assignee: Beckhoff Automation GmbH, Verl (DE)

( * ) Notice: Subject to any disclaimer, the term of this patent is extended or adjusted under 35 U.S.C. 154(b) by 0 days.

(21) Appl. No.: 17/337,035

(22) Filed: Jun. 2, 2021

(65) Prior Publication Data

US 2021/0289654 A1    Sep. 16, 2021

Related U.S. Application Data

(63) Continuation of application No. PCT/EP2019/086359, filed on Dec. 19, 2019.

(30) Foreign Application Priority Data

Dec. 28, 2018 (DE) ...................... 10 2018 133 647.0

(51) Int. Cl.
    *G06F 1/16* (2006.01)
    *H05K 5/00* (2006.01)
    (Continued)

(52) U.S. Cl.
    CPC ......... *H05K 7/1465* (2013.01); *H05K 7/1467* (2013.01); *H05K 7/1468* (2013.01)

(58) Field of Classification Search
    CPC .. H05K 7/1465; H05K 7/1467; H05K 7/1468; H05K 7/1469; H05K 7/1472;
    (Continued)

(56) References Cited

U.S. PATENT DOCUMENTS

| 789,671 A | 5/1905 | Reich |
|---|---|---|
| 4,152,750 A | 5/1979 | Bremenour et al. |

(Continued)

FOREIGN PATENT DOCUMENTS

| CN | 1662128 A | 8/2005 |
|---|---|---|
| CN | 1684578 A | 10/2005 |

(Continued)

OTHER PUBLICATIONS

Office Action dated Feb. 25, 2022 in connection with Chinese patent application No. 20980086931.9, 22 pages including English translation.

(Continued)

*Primary Examiner* — Anthony M Haughton
(74) *Attorney, Agent, or Firm* — Dorsey & Whitney LLP

(57) ABSTRACT

A control-cabinet system includes a base module and a plurality of functional modules. The base module housing has a face with openings, first connection elements and second connection elements. The first connection elements provide data and extra-low voltage connections, and the second connection elements provide low voltage connections. The first connection elements are arranged within the housing, in the area of the openings. The data connections are connected to a data line, the extra-low voltage connections are connected to an extra-low voltage line, and the low voltage connections are connected to a low voltage line. The functional modules each have a housing, an electronic circuit, and a module connection element connected to the electronic circuit. The module housing has a face with an opening. The module connection element comprises a first plug-in element extending through the opening, and adapted to engage the first connection elements of the base module.

20 Claims, 24 Drawing Sheets

(51) Int. Cl.
*H05K 7/00* (2006.01)
*H05K 7/14* (2006.01)

(58) Field of Classification Search
CPC ...... H05K 7/1474; H05K 7/1475; G06F 1/18; G06F 1/189
See application file for complete search history.

(56) References Cited

U.S. PATENT DOCUMENTS

| | | | |
|---|---|---|---|
| 5,493,194 | A | 2/1996 | Damiano et al. |
| 5,510,960 | A * | 4/1996 | Rosen ................. H01R 9/2425 361/624 |
| 5,716,241 | A * | 2/1998 | Hennemann ............ G06F 1/185 439/716 |
| 5,761,052 | A | 6/1998 | Wheeler-King et al. |
| 6,123,585 | A | 9/2000 | Hussong et al. |
| 6,172,875 | B1 * | 1/2001 | Suzuki ................. H05K 7/1465 361/752 |
| 6,172,877 | B1 * | 1/2001 | Feye-Hohmann ... H05K 7/1468 361/740 |
| 6,881,101 | B2 | 4/2005 | Sichner et al. |
| 6,916,194 | B2 | 7/2005 | Sichner et al. |
| 7,021,974 | B2 | 4/2006 | Sichner et al. |
| 7,257,003 | B2 | 8/2007 | Ono |
| 7,277,286 | B2 * | 10/2007 | Lee ........................ H05K 7/209 361/689 |
| 7,397,668 | B2 | 7/2008 | Sekine et al. |
| 7,616,453 | B2 | 11/2009 | Bergmann |
| 7,724,521 | B2 * | 5/2010 | Nelson ............... H05K 7/20163 361/695 |
| 7,753,740 | B2 | 7/2010 | Carolis et al. |
| 7,933,104 | B2 | 4/2011 | Bauer et al. |
| 7,967,646 | B2 | 6/2011 | Carolis et al. |
| 8,891,220 | B2 | 11/2014 | Shimizu et al. |
| 9,112,318 | B2 | 8/2015 | Cech et al. |
| 9,456,518 | B2 | 9/2016 | Bury et al. |
| 9,474,187 | B2 | 10/2016 | Nelson et al. |
| 9,936,598 | B2 | 4/2018 | Gruber |
| 9,992,898 | B2 | 6/2018 | Tsutsumi et al. |
| 10,140,226 | B2 | 11/2018 | Veil et al. |
| 2004/0201972 | A1 | 10/2004 | Walesa |
| 2005/0185381 | A1 | 8/2005 | Ono |
| 2006/0126277 | A1 | 6/2006 | Tomkowiak |
| 2006/0136622 | A1 | 6/2006 | Rouvelin et al. |
| 2006/0259670 | A1 | 11/2006 | Meinke et al. |
| 2007/0066147 | A1 * | 3/2007 | Braunlich ............ H05K 7/1465 439/717 |
| 2009/0021920 | A1 | 1/2009 | Hund et al. |
| 2009/0309467 | A1 * | 12/2009 | Nelson ............... H05K 7/20536 312/223.1 |
| 2009/0310312 | A1 * | 12/2009 | Wayman ............ H05K 7/20418 361/709 |
| 2010/0103627 | A1 * | 4/2010 | Nelson ............... G05B 19/0421 361/730 |
| 2011/0131455 | A1 | 6/2011 | Law et al. |
| 2011/0164350 | A1 * | 7/2011 | Kanaya ................. H05K 7/1471 361/624 |
| 2011/0256749 | A1 | 10/2011 | Bayerer |
| 2012/0206881 | A1 * | 8/2012 | Nelson ....................... H03F 3/19 361/709 |
| 2012/0243623 | A1 | 9/2012 | Kisakuerek |
| 2013/0336359 | A1 | 12/2013 | Zink |
| 2013/0342152 | A1 | 12/2013 | Maeda et al. |
| 2014/0160679 | A1 * | 6/2014 | Kelty ................... G02B 6/4269 361/700 |
| 2014/0307367 | A1 | 10/2014 | Maeda et al. |
| 2015/0257286 | A1 | 9/2015 | Sichmann et al. |
| 2016/0037660 | A1 | 2/2016 | Budde et al. |
| 2016/0254612 | A1 | 9/2016 | Andrei et al. |
| 2016/0320761 | A1 | 11/2016 | Kirsamer et al. |
| 2016/0349721 | A1 | 12/2016 | Kang |
| 2017/0374756 | A1 | 12/2017 | Leen et al. |
| 2018/0069359 | A1 | 3/2018 | Müller et al. |
| 2021/0289653 | A1 | 9/2021 | Beckhoff |
| 2021/0298189 | A1 | 9/2021 | Siegenbrink et al. |
| 2021/0385964 | A1 | 12/2021 | Beckhoff et al. |

FOREIGN PATENT DOCUMENTS

| | | |
|---|---|---|
| CN | 101080858 A | 11/2007 |
| CN | 101192056 A | 6/2008 |
| CN | 101690019 A | 3/2010 |
| CN | 102047349 B | 5/2013 |
| CN | 103858281 A | 6/2014 |
| CN | 204014380 U | 12/2014 |
| CN | 104662844 A | 5/2015 |
| CN | 105580214 A | 5/2016 |
| CN | 105684563 A | 6/2016 |
| CN | 105746006 A | 7/2016 |
| CN | 105101753 B | 8/2017 |
| CN | 208400835 U | 1/2019 |
| DE | 4140611 C1 | 5/1993 |
| DE | 19525438 A1 | 1/1997 |
| DE | 19651961 A1 | 6/1998 |
| DE | 19748429 A1 | 5/1999 |
| DE | 19748531 A1 | 5/1999 |
| DE | 19902745 A1 | 8/2000 |
| DE | 19923569 A1 | 11/2000 |
| DE | 10006879 A1 | 8/2001 |
| DE | 4437316 C2 | 12/2001 |
| DE | 69715868 T2 | 10/2002 |
| DE | 10148470 A1 | 4/2003 |
| DE | 20211002 U1 | 12/2003 |
| DE | 102004018115 A1 | 11/2005 |
| DE | 102006056001 A1 | 6/2008 |
| DE | 102009005546 A1 | 12/2009 |
| DE | 102006049631 B4 | 3/2011 |
| DE | 102011110184 A1 | 2/2013 |
| DE | 202013003925 U1 | 6/2013 |
| DE | 102012213281 A1 | 1/2014 |
| DE | 102012021055 A1 | 4/2014 |
| DE | 102013202591 A1 | 8/2014 |
| DE | 102016000126 A1 | 7/2016 |
| DE | 112013007698 A5 | 9/2016 |
| DE | 202017104591 U1 | 11/2018 |
| DE | 102018133646 A1 | 7/2020 |
| DE | 102018133647 A1 | 7/2020 |
| DE | 102018133657 A1 | 7/2020 |
| DE | 102019106082 B4 | 6/2021 |
| EP | 0236711 A2 | 9/1987 |
| EP | 0661915 A1 | 7/1995 |
| EP | 0323579 B1 | 3/1997 |
| EP | 0895708 B1 | 10/1999 |
| EP | 1258957 A1 | 11/2002 |
| EP | 1269809 B1 | 10/2004 |
| EP | 1595313 B1 | 6/2007 |
| EP | 1593312 B1 | 8/2008 |
| EP | 1668969 B1 | 10/2009 |
| EP | 2111088 A2 | 10/2009 |
| EP | 2183751 A1 | 5/2010 |
| EP | 1383368 B1 | 12/2010 |
| EP | 2642602 A1 | 9/2013 |
| EP | 2642603 A1 | 9/2013 |
| EP | 2793540 A2 | 10/2014 |
| EP | 2986093 A1 | 2/2016 |
| EP | 3018983 A2 | 5/2016 |
| EP | 3019983 A1 | 5/2016 |
| JP | 2014529781 A | 11/2014 |
| JP | 2016502266 A | 1/2016 |
| JP | 2016092219 A | 5/2016 |
| JP | 2016534422 A | 11/2016 |
| JP | 2018514904 A | 6/2018 |
| JP | 6388770 B2 | 8/2018 |
| WO | 2004057937 A1 | 7/2004 |
| WO | 2008101513 A1 | 8/2008 |
| WO | 2009014530 A1 | 1/2009 |
| WO | 2015063292 A1 | 5/2015 |
| WO | 2015090345 A1 | 6/2015 |
| WO | 2020136010 A2 | 7/2020 |
| WO | 2020136081 A1 | 7/2020 |
| WO | 2020136084 A1 | 7/2020 |
| WO | 2020182877 A1 | 9/2020 |

(56) References Cited

FOREIGN PATENT DOCUMENTS

OTHER PUBLICATIONS

"Backplane," Wikipedia, 6 pages, <https://en.wikipedia.org/wiki/Backplane#Active_versus_passive_ . . . >.
"Festo and Rockwell: A partnership built on a shared commitment," <https://www.festo.eom/us/en/e/iot-technologies/festo-and-rockwell . . . > 6 pages.
"I/O-System" Hans Turck GmbH Co. KG, 10 pages, <https://www.turck.de/de/productgroup/Feldbustechnik . . . >.
"Passive Backplanes," Advantech, 1 page, <https://www.advantech.eu/products/passive-backplanes/sub_1-2jkogc>.
"Schaltschrank," Wikipedia, <https://de.wikipedia.org/w/index.php?title=Schaltschrank&oldid= . . . >, 9 pages with English translation.
"Verfahrenstechnik," Wikipedia, <https://de.wikipedia.org/w/index.php?title+Verfahrenstechnik . . . >, 21 pages including English translation.
"Werkzeugmaschine," Wikipedia, <https://de.wikipedia.org/w/index.php?title__Werkzeugmaschine . . . > 49 pages including English translation.
"Simatic ET 200, The I/O system for both inside and outside the control cabinet," Siemens, (2015) 18 pages including English translation.
Graphite Module: Crimson Control, Red Lion Automation Series, "IEC 61131 Logic Control Programming," 2016, 2 pages.
Red Lion Graphite Core Controller, Red Lion Automation Series, "Rugged Standalone Industrial Controller," 2016, 2 pages.
"35 solutions worth seeing at SPS IPC Drives," Vogel Business Media, 2017, 3 pages including English translation.
Red Lion Graphite HMIs, Red Lion Automation Series, "Rugged Operator Panels with Modular I/O," 2017, 4 pages.
"Simatic, ET 200pro Interfacemodul IM 154-8 CPU," Siemens, Dec. 2006, 280 pages including partial English translation.
International Search Report and Written Opinion dated Mar. 27, 2020 in connection with International Patent Application No. PCT/EP2019/086344, 32 pages including English translation.
International Search Report and Written Opinion dated Apr. 1, 2020 in connection with International Patent Application No. PCT/EP2019/086359, 30 pages including English translation.
Examination report dated Jun. 8, 2019 in connection with German patent application No. 10 2018 133 646.2, 18 pages including English translation.
Allen-Bradley, "FlexArmor" 1798 Technical Data, Aug. 2001, 20 pages.
Examination Report dated Aug. 8, 2019 in connection with German patent application No. DE 10 2018 133 647.0, 18 pages including English translation.
"Simatic, Dezentrales Peripheriesystem ET 200pro," Siemens, Sep. 2016, 517 pages including partial English translation.
International Search Report and Written Opinion dated Jun. 4, 2020 in connection with International Patent Application No. PCT/EP2020/056494, 31 pages including translation.
International Preliminary Report on Patentability dated Jul. 14, 2021 in connection with International Patent Application No. PCT/EP2020/056494, 33 pages including translation.
Japanese Office Action dated Jan. 31, 2022 in connection with Japanese patent application No. 2021-53787, 4 pages including English translation.
Partial Search Report dated Mar. 13, 2020 in connection with International Patent Application No. PCT/EP2019/084699, 27 pages including English translation.
International Search Report and Written Opinion dated Jun. 24, 2020 in connection with International Patent Application No. PCT/EP2019/084699, 37 pages including English translation.
Examination Report dated Aug. 13, 2019 in connection with German patent application No. DE 10 2018 133 657.8, 16 pages including English translation.
Office Action dated Feb. 28, 2022 in connection with Chinese patent application No. 201980086815.7, 24 pages including English translation.
EP9128-Ether_CAT-Sternverteiler in Schutzart IP67—Version 2.2.0, Beckhoff GmbH, Jul. 13, 2015, 45 pages.
Office Action dated Nov. 30, 2021 in connection with European patent application No. 19821065.0, 18 pages including English translation.
First Office Action dated Mar. 24, 2022 in connection with Chinese patent application No. 201980086871.0, 10 pages including English translation.
Office Action dated Jun. 8, 2022 in connection with Chinese Patent Application No. 2022080020520.2, 9 pages including English translation.
Office Action dated Jun. 27, 2022 in connection with Japanese patent application No. 2021-537884, 17 pages including English translation.
Office Action issued in Japanese Patent Application No. 2021-537936, dated Aug. 16, 2022, 18 pages including 12 pages of English translation.

\* cited by examiner

CONTROL-CABINET SYSTEM WITH BASE MODULE AND FUNCTIONAL MODULE, AS WELL AS FUNCTIONAL MODULE

CROSS-REFERENCE TO RELATED APPLICATIONS

The present application is a continuation of International Patent Application PCT/EP2019/086359, filed 19 Dec. 2019, entitled SWITCHING CABINET SYSTEM CONSISTING OF A BASE MODULE AND FUNCTIONAL MODULES, AND FUNCTIONAL MODULE, which claims priority of German patent application DE 10 2018 133 647.0, filed 28 Dec. 2018, entitled SCHALTSCHRANKSYSTEM AUS BASISMODUL UND FUNKTIONSMODULEN SOWIE FUNKTIONSMODUL, each of which is incorporated by reference herein, in the entirety and for all purposes.

FIELD

The present invention relates to a control-cabinet system comprising a base module and a plurality of functional modules, and to a functional module for such a control-cabinet system.

BACKGROUND

In modular field-bus systems, which may e.g. be used in automation systems, functional modules may be directly connected to one another or connected to one another via a base module. A field bus may be provided, which is passed on or forwarded from one functional module to the next. The field bus may also be used to provide an extra-low voltage power supply. Such a field-bus system is disclosed in DE 100 06 879 A1.

Thus, the disadvantage of this field-bus system is that a separate mains connection must be provided for functional modules such as a motor controller, for which a higher voltage is required. This complicates the wiring and installation of such a field-bus system if the functionality of a control cabinet is to be provided by the field-bus system. A control cabinet may contain the electrical and electronic components of a process plant (http://de.wikipedia.org/wiki/Verfahrenstechnik), of a machine tool (http://de.wikipedia.org/wiki/Werkzeugmaschine) or of manufacturing equipment that is not accommodated directly in the machine (see http://de.wikipedia.org/wiki/Schaltschrank).

SUMMARY

The invention provides a control-cabinet system comprising a base module and functional modules, and a functional module in which low voltages may be provided via the base module.

According to a first aspect, a control-cabinet system comprises a base module and a plurality of functional modules. The base module comprises a housing with a housing face and openings of the housing face, first connection elements and second connection elements. The first connection elements provide data connections and extra-low voltage connections, while the second connection elements provide low voltage connections. The first connection elements are arranged within the housing in the area of openings, with the data connections connected to a data line and the extra-low voltage connections connected to an extra-low voltage line. The low-voltage connections of the second connection elements are connected to a low-voltage line. The functional modules each comprise a module housing, an electronic circuit and a module connection element. The module connection element is connected to the electronic circuit. The module housing has a module housing face, wherein the module housing face has a module housing opening. The module connection element comprises a first plug-in element, wherein the first plug-in element extends through the module housing opening from inside of the module housing to the outside of the module housing and is embodied to engage with the first connection elements of the base module. This provides a control-cabinet system capable of providing data, extra-low voltage and low voltage by means of the base module.

A field bus may be provided via the data connections which may be used for communication between the base module and the functional modules. The field bus may be embodied as a field bus defined in the IEC 61158 standard, in particular as EtherCAT or EtherCAT P.

Extra-low voltages are in this context understood to be electrical voltages up to 50 volts AC and/or 120 volts DC, in particular up to 25 volts AC and/or 60 volts DC. This definition of extra-low voltage may be taken from the IEC60449 standard. Low voltages are understood to be electrical voltages above the extra-low voltage and up to 1000 volts AC and/or 1500 volts DC. Furthermore, a supply voltage for communication electronics may be provided by means of the data line. This supply voltage may be in the range of a few volts.

A maximum current strength that may be provided through the extra-low voltage connections may be 40 amps. A maximum current strength that may be provided through the low voltage connections may be 75 amps. Larger maximum current strengths may also be provided.

It may be provided that the openings of the housing are covered with the functional modules, so that a common housing comprising the housing and the module housings encloses the electronic circuits of the functional modules and the first connection elements, the second connection elements as well as the data line, the extra-low voltage line and the low voltage line.

According to a second aspect, a functional module comprises a module housing, an electronic circuit and a module connection element. The module housing has a module housing face and further module housing faces. The module housing face has a module housing opening. The module connection element comprises a first plug-in element, wherein the first plug-in element extends through the module housing opening and is configured to engage with a first connection element of a base module. The module connection element is connected to the electronic circuit to provide electrical contact between the module connection element and the electronic circuit. The functional module may be provided for use in a control-cabinet system.

It may be provided that the module housing is accessible through the module housing opening. Then the functional module may be serviced by means of an intervention through the module housing opening, for example by replacing a fuse or replacing an electronic component of the electronic circuit. For this purpose, it may also be provided that the electronic circuit is embodied to be removable from the functional module, for example after fastening screws are loosened.

In order to provide the functionality of a control cabinet, the functional modules within the control-cabinet system may be embodied as input modules for reading sensor data, as output modules for outputting voltages, as PLC control modules, as motor control modules, as power supply modules and/or as feed-in modules. A feed-in module may take over the task of providing data, in particular in the form of a field bus, for the base module and/or serve to supply the base module with an extra-low voltage and/or a low voltage. Furthermore, computer modules, network switch modules, servo control modules, line filter modules, contactor modules, bus coupler modules, active or passive power factor correction modules and/or frequency converter modules or a combination of the modules mentioned may be embodied as functional modules.

In addition, a seal may be provided between the base module and the functional modules in order to protect the system of base modules and functional modules against dust and liquids. Protection against contact may already be provided by attaching the functional modules to the base module and thereby covering the module housing opening of the functional modules. This is particularly the case if the module housing opening faces the base module. On the one hand, this facilitates maintenance of the functional modules since the interior of the functional modules is accessible as soon as the functional module is removed from the base module, and on the other hand, it provides a touch-proof and preferably liquid- and dust-tight system of base module and functional modules. In order to perform the various tasks, it may be provided that the module housing has further connection elements on one of the further module housing faces, which are e.g. connected to sensors, actuators or other elements typically controlled by a control cabinet.

EXAMPLES

In an embodiment, the housing face is flat. In an embodiment, the module housing face is flat. It may be provided in this context that both the housing face and the module housing face of all functional modules are flat.

In another embodiment, the module connection element of at least one functional module comprises a second plug-in element that is configured to engage with the second connection elements of the base module. As a result, low voltage is available to the at least one functional module.

In an embodiment, the first plug-in element and the second plug-in element are arranged at a distance from each other. This may be due to the fact that the first connection elements and the second connection elements of the base module are arranged at a distance from each other, as well. In particular, this allows data and extra-low voltage to be provided by the base module at a first location and tapped by the functional modules, and the low voltage to be provided or tapped at a second location.

In another embodiment, the second plug-in elements extend from inside of the housing through the openings to the outside of the housing. The second plug-in element is arranged inside of the module housing. This allows a distance between the second plug-in element and the low voltage line to be increased, thereby reducing leakage currents.

In an embodiment, the second connection elements extend from inside of the housing through the openings to the outside of the housing. The second plug-in element extends through the module housing opening from the inside of the module housing to the outside of the module housing. Again, leakage currents may be reduced and additionally, leakage currents between the second plug-in element and the electronic circuit may be reduced.

In an embodiment, the second connection elements are arranged inside of the housing in the area of openings. The second plug-in element extends through the module housing opening from inside of the module housing to the outside of the module housing. As a result, leakage currents between the second plug-in element and the electronic circuit may be reduced.

In another embodiment, the first plug-in element is divided up into at least a first portion and a second portion. First plug-in contacts for transmitting data are arranged in the first portion. Second plug-in contacts for transmitting extra-low voltage are arranged in the second portion. The first connection element is subdivided into at least a third portion and a fourth portion, third plug-in contacts for transmitting data being arranged in the third portion and fourth plug-in contacts for transmitting extra-low voltage being arranged in the fourth portion, wherein the first plug-in contacts may be connected to the third plug-in contacts and the second plug-in contacts may be connected to the fourth plug-in contacts. In this way, an advantageously constructed geometry of the first plug-in element or the first connection element may be achieved, wherein the first plug-in contacts and the second plug-in contacts may be embodied differently.

It may be provided that the third plug-in contacts are connected to the data line and the fourth plug-in contacts are connected to the extra-low voltage line.

In another embodiment, the first plug-in contacts and the third plug-in contacts, respectively, include a first communication voltage contact, a second communication voltage contact, a first data connection element, a second data connection element, a third data connection element, a fourth data connection element, a fifth data connection element, and a sixth data connection element.

The first and second communication voltage contacts may be used to provide a voltage necessary for operating communication electronics, e.g. for up to five volts. This allows functional modules that do not engage with the fourth plug-in contacts with second plug-in contacts to be supplied with the voltage necessary for communication electronics.

The first data connection element and the second data connection element may be provided for transmitting a communication telegram. The third data connection element and the fourth data connection element may serve for shielding. The fifth data connection element and the sixth data connection element may be provided for receiving a communication telegram. The transmitting or receiving of the communication telegram is to refer to the transmission direction from the functional module to the base module. Corresponding plug-in contacts for receiving and transmitting communication telegrams are provided in the base module. The first to sixth data connection elements may be provided for the exchange of data based on the EtherCAT protocol or on another protocol.

The first to sixth data connection elements may form a first communication channel. Further data connection elements may be provided for further communication channels. The first communication channel may be bidirectional and thus allow simultaneous transmission and reception of a communication protocol, respectively.

It may further be provided that the first data connection element and the second data connection element are both configured for transmitting and receiving a communication telegram. The fifth data connection element and the sixth data connection element may also be configured for transmitting and receiving a communication telegram. In this case, redundancy exists so that if one transmitting or receiving direction fails, the data connection elements that are not affected in each case may also take over reception or transmission.

In an embodiment, the second plug-in contacts and fourth plug-in contacts, respectively, comprise at least a first DC contact, a second DC contact, a third DC contact, a fourth DC contact, a fifth DC contact, a sixth DC contact, and a protective conductor connection.

In another embodiment, the module housing is accessible through the module housing opening, e.g. in order to replace a fuse within the functional module and/or to remove the electronic circuit.

In another embodiment, the first plug-in element is used to transmit data. This allows a functional module to be provided, which in turn communicates with other elements outside the control-cabinet system. In addition, the first plug-in element may serve to transmit extra-low voltage.

In another embodiment, the module connection element has a second plug-in element that is configured to engage a second connection element of the base module. The second plug-in element may serve to transmit low voltage.

In an embodiment, the first plug-in element and the second plug-in element are arranged at a distance from each other. This allows the first connection element and the second connection element to be engaged with at different points.

In another embodiment, the second plug-in element is arranged inside of the module housing. This allows to engage with a second plug-in element which is guided through an opening of a housing of a base module.

In an embodiment, the second plug-in element extends through the module housing opening from inside of the module housing to the outside of the module housing. This enables engaging with a second connection element of a base module, which is either arranged inside of a housing of the base module, or also engaging with a second connection element of the base module, wherein the second connection element is guided through an opening of a housing of a base module, depending on the embodiment of the second connection element or second plug-in element.

In another embodiment, the first plug-in element is divided up into at least a first portion and a second portion. First plug-in contacts for transmitting data are arranged in the first portion. Second plug-in contacts for transmitting extra-low voltage are arranged in the second portion. In this way, an advantageously constructed geometry of the first plug-in element may be achieved, wherein the first plug-in contacts and the second plug-in contacts may have different configurations.

In an embodiment, the first plug-in contacts include a first communication voltage contact, a second communication voltage contact, a first data connection element, a second data connection element, a third data connection element, a fourth data connection element, a fifth data connection element, and a sixth data connection element.

The first and second communication voltage contacts may be used to supply the functional module with a voltage required for operating communication electronics, e.g. up to five volts. In this way, functional modules that do not have second plug-in contacts may be supplied with the voltage required for communication electronics.

The first data connection element and the second data connection element may be provided for transmitting a communication telegram. The third data connection element and the fourth data connection element may serve for shielding. The fifth data connection element and the sixth data connection element may be provided for receiving a communication telegram. The first to sixth data connection elements may be provided for exchanging data based on the EtherCAT protocol or on another protocol.

It may further be provided that the first data connection element and the second data connection element are both configured for transmitting and receiving a communication telegram. The fifth data connection element and the sixth data connection element may also be configured for transmitting and receiving a communication telegram. In this case, redundancy is provided so that if one transmitting or receiving direction fails, the data connection elements that are not affected in each case may take over reception or transmission, as well.

The first to sixth data connection elements may form a first communication channel. Additional data connection elements may be provided for further communication channels. The first communication channel may be bidirectional and thus allow simultaneous transmission and reception of one communication protocol each.

In an embodiment, the second plug-in contacts comprise at least a first DC voltage contact, a second DC voltage contact, a third DC voltage contact, a fourth DC voltage contact, a fifth DC voltage contact, a sixth DC voltage contact, and a protective conductor connection. Thereby, a permanent DC voltage with twenty-four volts may be transmitted between the first DC voltage contact and the second DC voltage contact, a switchable DC voltage with twenty-four volts may be transmitted between the third DC voltage contact and the fourth DC voltage contact, and a permanent DC voltage with forty-eight volts may be transmitted between the fifth DC voltage contact and the sixth DC voltage contact.

In an embodiment, the module housing is accessible through the module housing opening, e.g. in order to replace a fuse within the functional module and/or to remove the electronic circuit.

In another embodiment, the module housing comprises a metal. In particular, the module housing may comprise a metal. In particular, the metal may comprise aluminum and/or zinc.

In an embodiment, the module housing comprises a bar-pressed section. In one embodiment, the module housing is a die-cast housing. Both housing forms are particularly suitable for metal housings, particularly if the metal housings are embodied as aluminum bar-pressed profiles or zinc die-cast housings.

In an embodiment, the functional module comprises a fuse, wherein the module connection element is protected by means of the fuse. This means that the fuse is arranged between the module connection element and the electronic circuit. The fuse may then in particular be arranged inside of the module housing and be accessible through the module housing opening. On the one hand, this provides protection for the electronic circuit of the functional module, and on the other hand, the fuse may easily be replaced.

In another embodiment of the functional module, it has a cover that is attached to the module housing in such a way that the module housing opening is at least partially covered and the cover may be removed. Since neither dust protection nor contact protection nor protection against the ingress of liquids needs to be rendered by means of this cover since these categories of protection are already achieved by attaching the functional module to the base module, the cover may e.g. be inserted into the module housing opening without a seal and may thus be removed easily and in particular without the use of tools. The cover may be used to provide a certain degree of protection against contact, especially if parts of the electronic circuit are covered by the cover.

In an embodiment, the module housing comprises passive cooling elements, in particular cooling ribs and/or cooling fins. This allows heat to be dissipated from the inside of the module housing to the outside and improves heat exchange with the surrounding air.

In another embodiment, the module housing is embodied in such a way that the module housing may be attached to a base module. This may e.g. be done by means of through holes on the module housing, by means of which the module housing may be screwed to the base module. For this purpose, the base module may have corresponding threaded holes. Alternatively or additionally, the module housing may have a buckle that may be hooked into a counterpart of the base module for locking.

In another embodiment, the functional module has a circuit board, wherein the electronic circuit is at least partially arranged on the circuit board. The module connection element, in particular the first plug-in element or the second plug-in element, may also be arranged on the circuit board so that in total a compact structure of the electronic circuit of the functional module is possible.

In another embodiment, the module housing face is flat.

BRIEF DESCRIPTION OF THE DRAWINGS

The present invention will be discussed in more detail below by means of examples of embodiments and with reference to figures. Here, in a schematic illustration in each case:

FIG. 1 shows an isometric top view of a functional module 100 for a control-cabinet system. The functional module 100 comprises a module housing 110 with a module housing face 111 and further module housing faces 112. An electronic circuit 120 is arranged within the module housing 110, to which a module connection element 130 is connected. The module housing face 111 includes a module housing opening 114 extending substantially across the entire module housing face 111. The module connection element 130 is configured as a first plug-in element 131 and extends through the module housing opening 114 from the interior of the module housing 110 to the exterior of the module housing 110. The module connection element 130 is further configured to engage a first connection element of a base module. By means of the first plug-in element 131, transmission of data or data and extra-low voltage may be provided.

Depending on the function to be carried by the functional module 100, the electronic circuit 120 may be embodied differently. Furthermore, the module housing 110 may be embodied differently depending on the configuration of the electronic circuit 120.

In order to provide various functionalities of a control cabinet, the functional module 100 may be embodied as an input module for reading sensor data, as an output module for outputting voltages, as a PLC control module, as a motor control module, as a power supply module and/or as a feed-in module. A feed-in module may take over the task of providing the field bus for a base module and/or serve to supply the base module with an extra-low voltage and/or a low voltage. Furthermore, the functional module 100 may be embodied as a computer module, network switch module, servo control module, line filter module, contactor module, bus coupler module, active or passive power factor correction module and/or frequency converter module or as a combination of the modules mentioned.

Figure 1:
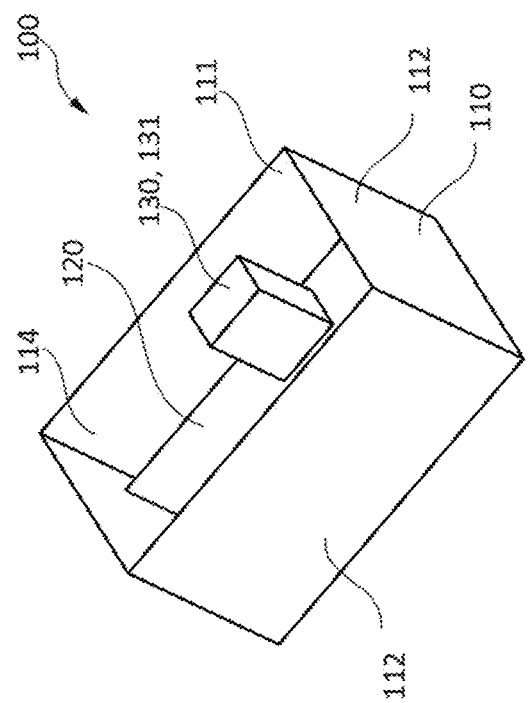
FIG. 1 shows an isometric view of a functional module.

The plug-in element 131 may be embodied as a plug or as a socket, wherein the exact configuration of the plug-in element is kept open in the depiction of FIG. 1.

As shown in FIG. 1, the module housing face 111 may be flat.

Figure 2:
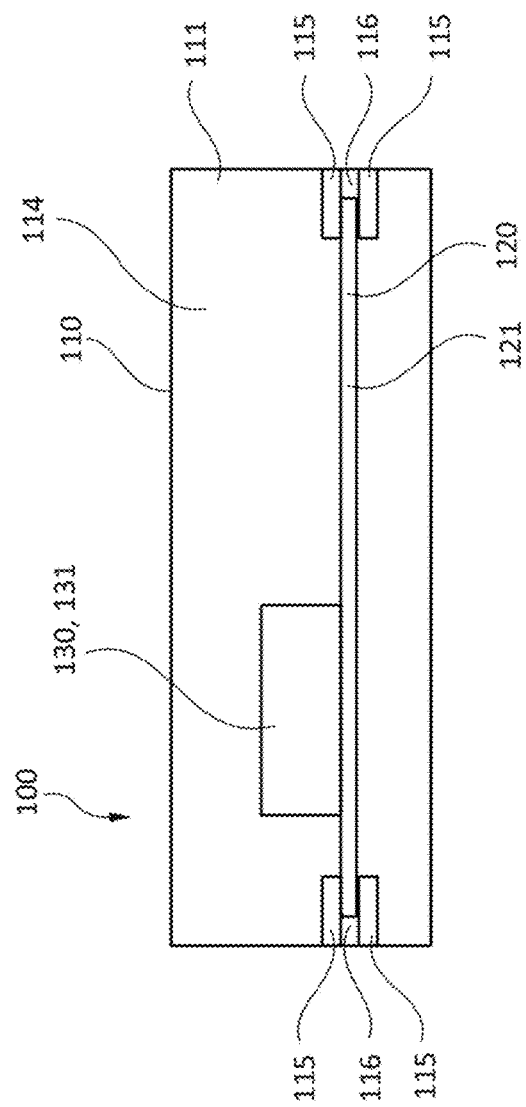
FIG. 2 shows a rotated top view of the functional module.

FIG. 2 shows a rotated top view of the module housing face 111 of the functional module 100 of FIG. 1, in which the electronic circuit 120 is arranged on a module circuit board 121, meaning that electronic components of the electronic circuit 120 are arranged on the module circuit board 121 and are interconnected by means of conductor paths. The module connection element 130 is also arranged on the module circuit board 121. The module housing 110 additionally has projections 115 through which guide grooves 116 are formed, wherein the module circuit board 121 is guided within the guide grooves 116 within the module housing 110. In this case, the projections 115 and the guide grooves 116 are not guided up to the module housing face 111 visible in FIG. 1. Alternatively, it is possible to guide the projections 115 and the guide grooves 116 up to the module housing face 111. Furthermore, fastening means for fastening the module circuit board 121 within the module housing 110 may be provided.

The module housing opening 114 provides access to the module housing 110, e.g. to remove the module circuit board 121 and repair the electronic circuit 120.

Figure 3:
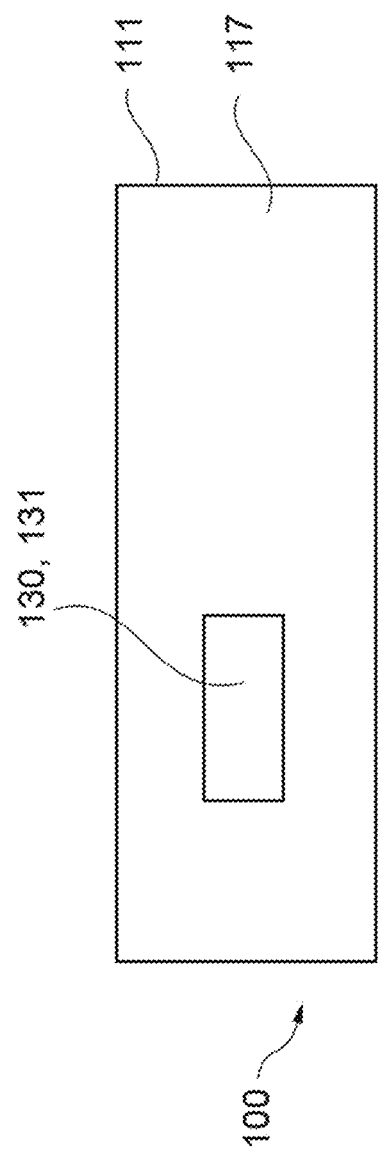
FIG. 3 shows a top view of a further functional module.

FIG. 3 shows a top view of a functional module 100 which corresponds to the functional module of FIGS. 1 and 2, unless differences are described in the following. The functional module 100 has a cover 117, wherein by means of the cover 117 the module housing opening 114 is substantially closed. As a result, the module circuit board 121 and the projections 115 and guide grooves 116 of the functional module 100 of FIGS. 1 and 2 are no longer visible in the top view, but may still be present behind the cover 117. The cover 117 is embodied such that the module connection element 130 is guided through the cover 117. The cover 117 may in this context be made of a plastic and be inserted, in particular clipped, into the module housing 110. The electronic circuit is protected against contact by the cover 117.

Alternatively or in addition to the cover 117, it may be provided that the module housing 110 is cast with an electrically insulating material.

Figure 4:
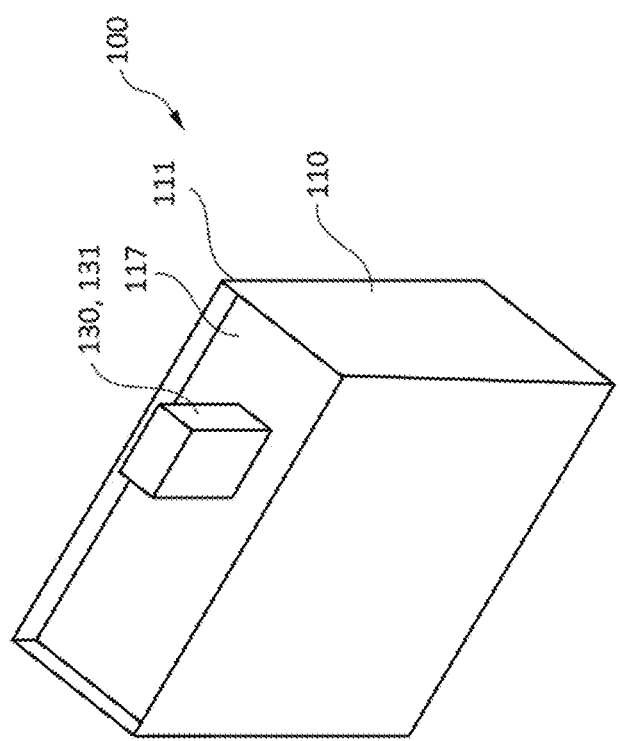
FIG. 4 shows a rotated isometric view of the further functional module.

FIG. 4 shows a rotated isometric view of the functional module 100 of FIG. 3. As shown in FIG. 4, the cover 117 is not arranged directly at the module housing face 111, but is offset somewhat into the module housing 110. However, the cover 117 may also be arranged at level with the module housing face 111.

In an embodiment, a data module connection or an extra-low voltage module connection is provided via the module connection element 130. Furthermore, a low-voltage module connection may be provided via the module connection element 130.

Figure 5:
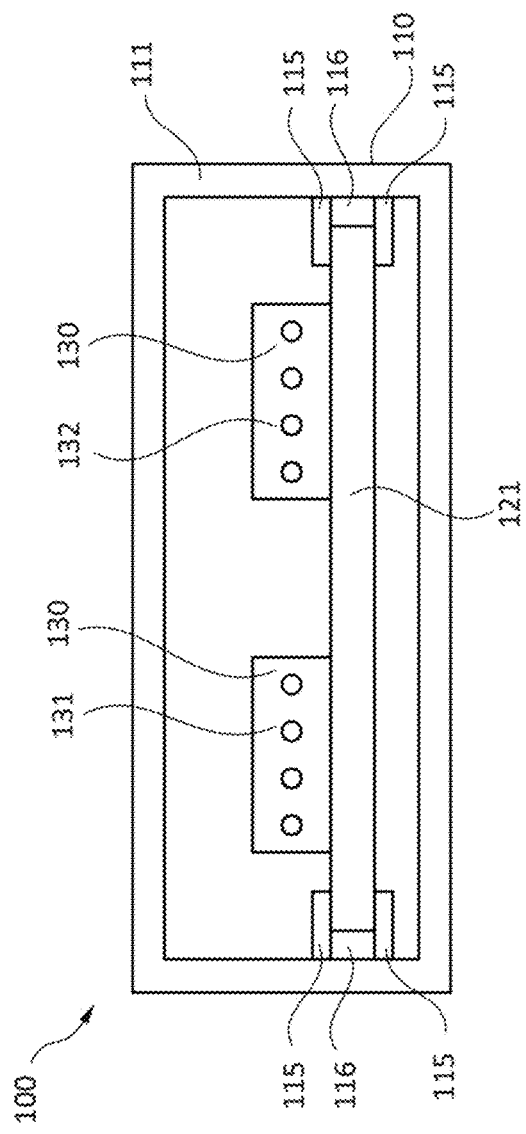
FIG. 5 shows a top view of a further functional module.

FIG. 5 shows a top view of a functional module 100 that corresponds to the functional module of FIGS. 1 and 2, unless differences are described in the following. In particular, the functional module 100 does not have a cover in analogy to FIG. 3 or 4, although such a cover could also be provided. In this functional module 100, the module connection element 130 is divided up into a first plug-in element 131 and a second plug-in element 132. The first plug-in element 131 is embodied to engage with a first connection element of a base module. The second plug-in element 132 is embodied to engage with a second connection element of a base module. The first plug-in element 131 and the second plug-in element 132 are embodied to be spaced apart from each other. It may be provided to transmit data or data and extra-low voltage by means of the first plug-in element 131. The second plug-in element 132 may be used to transmit low voltage.

Figure 6B:
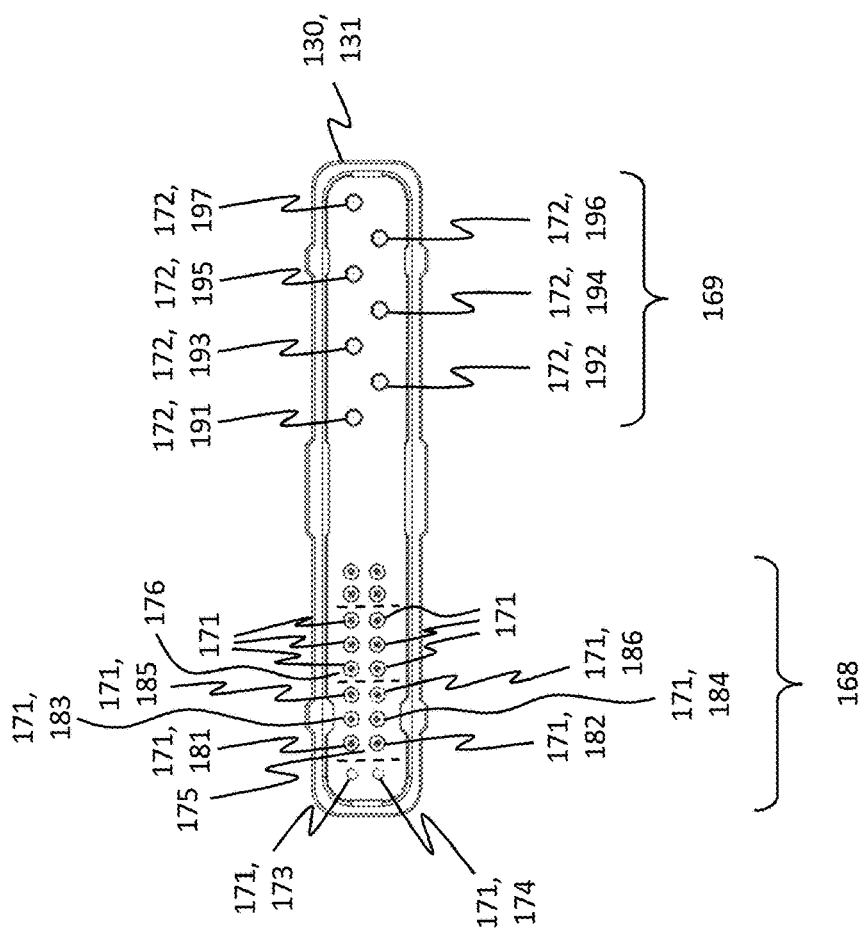
FIG. 6A shows an isometric view and FIG. 6B shows a top view of a first plug-in element.
Figure 6A:
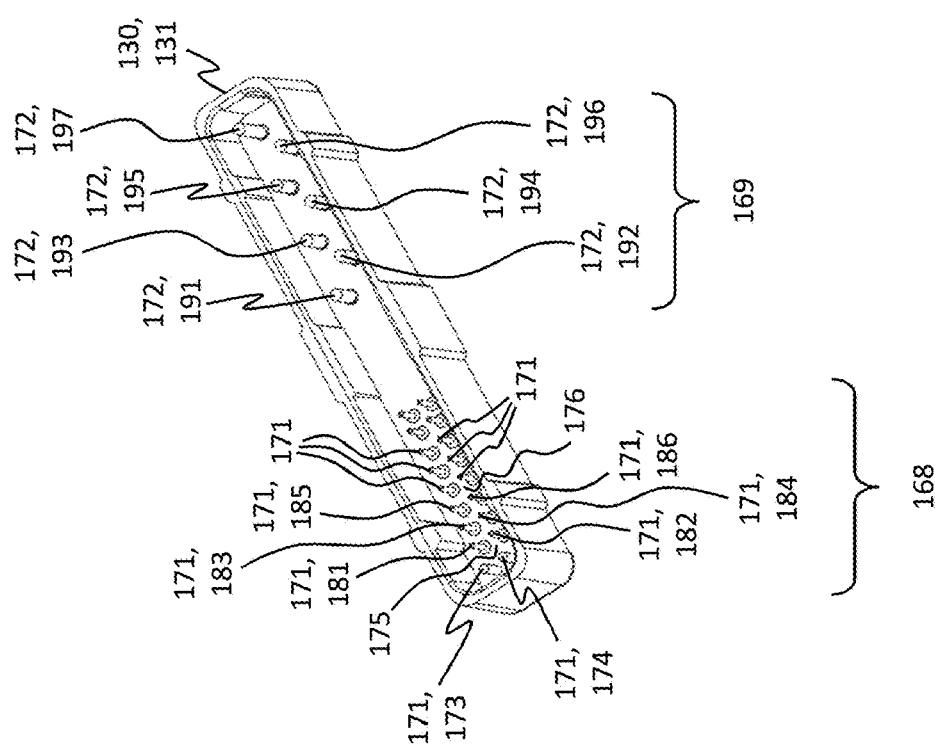

FIG. 6A shows an isometric view and FIG. 6B shows a top view of a further first plug-in element 131 that may serve as a connection element 130 for a functional module. The first plug-in element 131 has a first portion 168 and a second portion 169. First plug-in contacts 171 are arranged in the first portion 168. The first plug-in contacts 171 are provided for transmitting data. Second plug-in contacts 172 are arranged in the second portion 169. The second plug-in contacts 172 are provided for transmitting extra-low voltage. The first plug-in contacts 171 are arranged in pairs, while the second plug-in contacts 172 are arranged in a zigzag line.

The first plug-in contacts 171 thereby comprise a first communication voltage contact 173, a second communication voltage contact 174, a first data connection element 181, a second data connection element 182, a third data connection element 183, a fourth data connection element 184, a fifth data connection element 185 and a sixth data connection element 186. The first to sixth data connection elements 181, 182, 183, 184, 185, 186 thereby form a first communication channel 175. Further first plug-in contacts 171 form a second communication channel 176 which may be formed in analogy to the first communication channel.

Via the first communication voltage contact 173 and the second communication voltage contact 174, the functional module may be supplied with a voltage necessary for operating communication electronics, for example up to five volts. In this way, functional modules that do not have second plug-in contacts 172 may be supplied with the voltage required for communication electronics.

The first data connection element 181 and the second data connection element 182 may be provided for transmitting a communication telegram. The third data connection element 183 and the fourth data connection element 184 may be provided for shielding. The fifth data connection element 185 and the sixth data connection element 186 may be provided for receiving a communication telegram. The first to sixth data connection elements 181, 182, 183, 184, 185, 186 may be provided for exchanging data based on the EtherCAT protocol or on another protocol. Thus, the first communication channel 175 may be provided for exchanging data based on the EtherCAT protocol or on another protocol. The second communication channel 176 may be embodied analogously. The first communication channel 175 and the second communication channel 176 may be embodied bidirectionally and thus allow simultaneous transmitting and receiving of one communication protocol each.

The second plug-in contacts 172 include a first DC contact 191, a second DC contact 192, a third DC contact 193, a fourth DC contact 194, a fifth DC contact 195, a sixth DC contact 196, and a protective conductor connection 197. Thereby, a permanent DC voltage with twenty-four volts may be transmitted between the first DC voltage contact 191 and the second DC voltage contact 192, a switchable DC voltage with twenty-four volts may be transmitted between the third DC voltage contact 193 and the fourth DC voltage contact 194, and a permanent DC voltage with forty-eight volts may be transmitted between the fifth DC voltage contact 195 and the sixth DC voltage contact 196.

Figure 7:
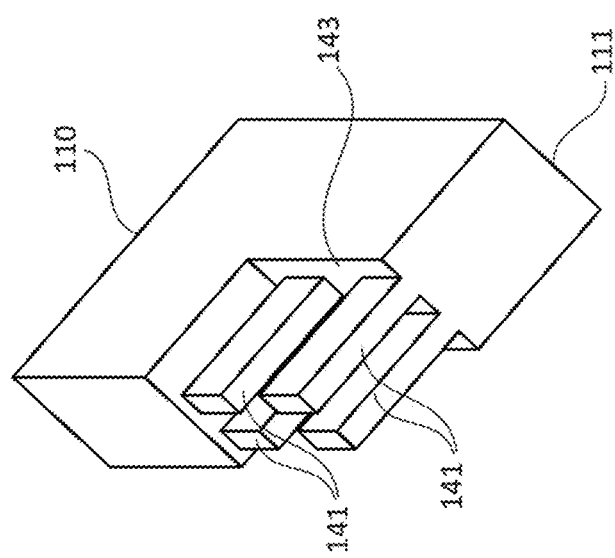
FIGS. 7 to 10 show module housings with cooling ribs or cooling fins.

FIG. 7 shows a module housing 110 in which passive cooling elements, here embodied as rod heat sinks 141, form part of the module housing 110. Cooling of the interior of the module housing 110 is possible via the rod heat sinks 141.

Figure 8:
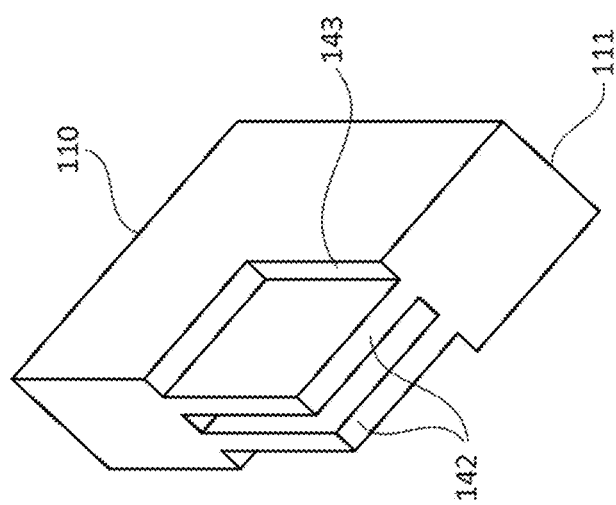

FIG. 8 shows a further module housing 110 in which the passive cooling elements are embodied as extruded heat sinks 142 instead of rod heat sinks. The rod heat sinks 141 of FIG. 7 and the extruded heat sinks 142 of FIG. 8 are not guided over the entire module housing 110, but only over a partial area 143.

Figure 9:
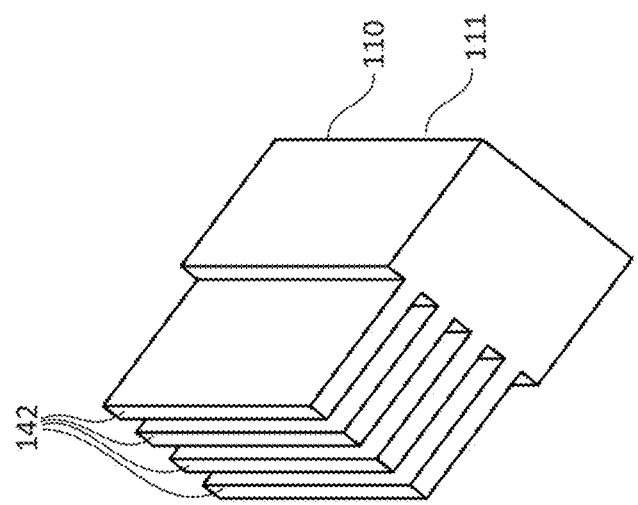

FIG. 9 also shows a further module housing 110 in which extruded heat sinks 142 are guided over the entire module housing 110. The rod heat sinks 141 of FIG. 7 and the extruded heat sinks 142 of FIGS. 8 and 9 are arranged opposite to the module housing face with the module housing opening 114.

Figure 10:
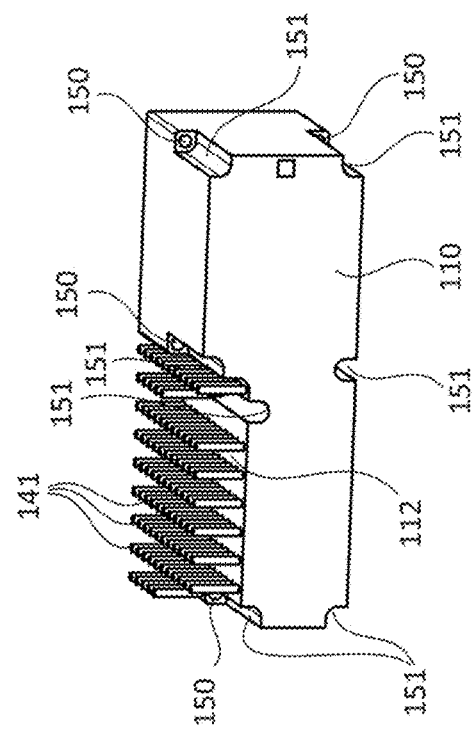

FIG. 10 shows another module housing 110 in which the rod heat sinks 141 are arranged on another module housing face 112. In this case, the rod heat sinks 141 are arranged on the side of the module housing 110 and not opposite to the module housing face with the module housing opening. Furthermore, the module housing 110 of FIG. 10 comprises through holes 150 accessible through recesses 151. For example, screws may be guided through the through holes 150 in order to fasten the module housing 110 and thus a functional module to a base module. The screw heads are accessible through the recesses 151 to enable the screw connection.

In order to securely retain the functional module at a base module, at least four through holes 150 may be provided. Depending on the size of the functional module, more than four through holes 150 may be provided.

Figure 11:
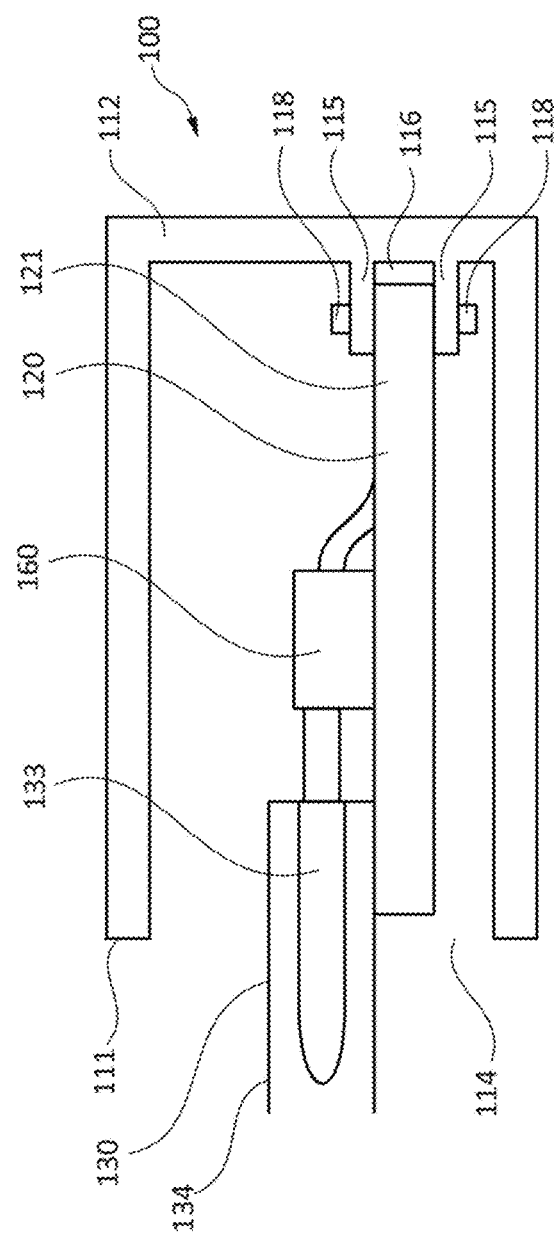
FIG. 11 shows a cross-section through another functional module.

FIG. 11 shows a cross-section through a functional module 100. On the inside, the module housing 110 has projections 115 on a further module housing face 112 opposite to the module housing opening 114, as well, which projections form a guide groove 116 and into which a module circuit board 121 of the electronic circuit 120 is guided. In the region of the projections 115, the module circuit board 121 is secured by means of fastening means 118. Such fastening means 118 may alternatively or additionally be provided on the projections and guide grooves of FIG. 2 and FIG. 5, respectively.

The module connection element 130 is embodied as a connector 133 with a protective housing 134. The protective housing 134 projects beyond the connector 133 in such a way that the connector 133 and thus the module connection element 130 are embodied to be safe from contact.

Further, the electronic circuit 120 includes an optional fuse 160 between the connector 133 and the module circuit board 121. Should an excessive current flow through the connector 133, the module circuit board 121 may be protected from this excessive current by means of the fuse 160. The fuse 160 is accessible through the module housing opening 114 and may easily be replaced in the event of tripping/loosening.

Both the touch-proof connector 133 having the protective housing 134 and the fuse 160 may independently from one another be implemented in a functional module 100.

The connector 133 may be part of the first plug-in element 131 shown in FIGS. 5 and 6 or part of the second plug-in element 132 shown in FIG. 5.

Figure 12:
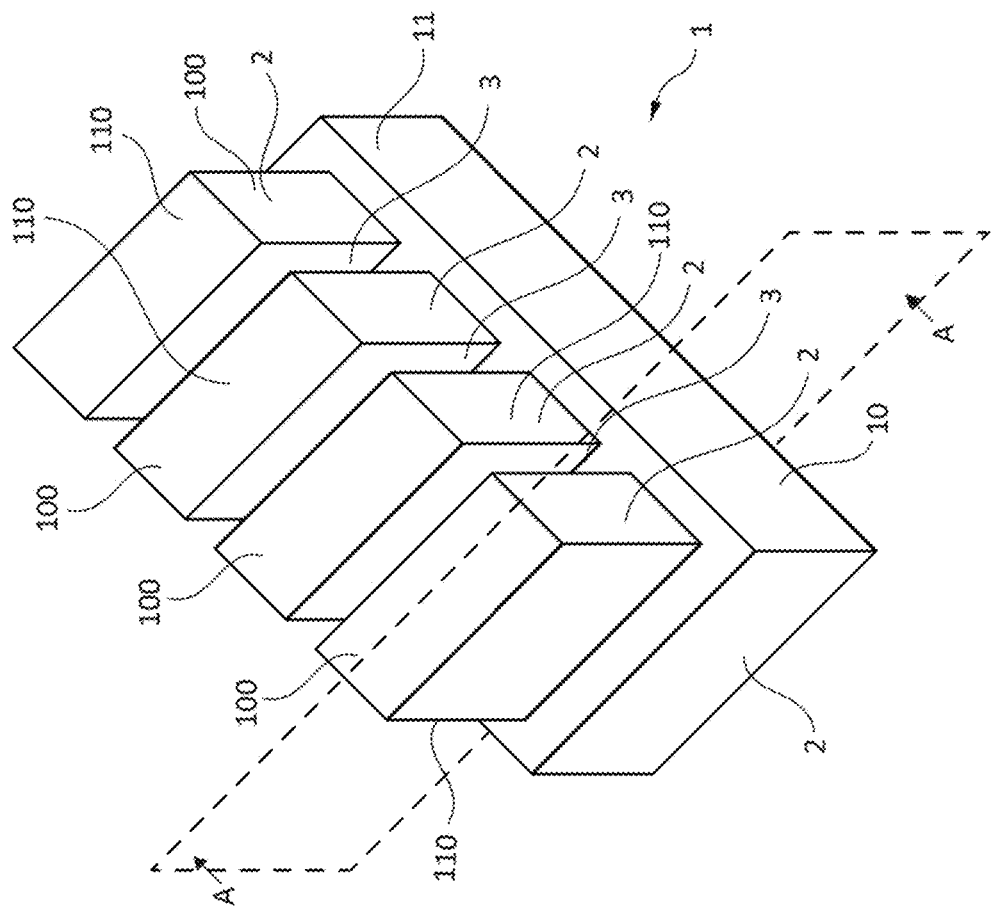
FIG. 12 shows a control-cabinet system with a base module and a plurality of functional modules.

FIG. 12 shows an isometric top view of a control-cabinet system 1 with a base module 10 and four functional modules 100. An intermediate space 3 is free between the functional modules 100, which may be used for ventilation of the functional modules 100. If one of the functional modules 100 requires more cooling, one of the module housings 110 shown in FIGS. 7 to 10 may be used instead of the module housings 110 shown.

The functional modules 100 may be embodied according to any of FIGS. 1 to 11. The base module 10 provides a data line, an extra-low voltage line and optionally a low-voltage line and has extra-low voltage connections, data connections and optionally low-voltage connections. The module connection elements of the functional modules 100 may engage with these connection elements of the base module. This allows a communication link to be provided between the functional modules 100, as well as a power supply for the functional modules 100.

The module housings 110 and the housing 11 form a common housing 2 of the control-cabinet system 1, wherein all openings of the housing 11 as well as of the module housings 110 are closed by the common housing 2, thus providing a touch-protected, dust- and liquid-tight control-cabinet system 1.

Figure 13:
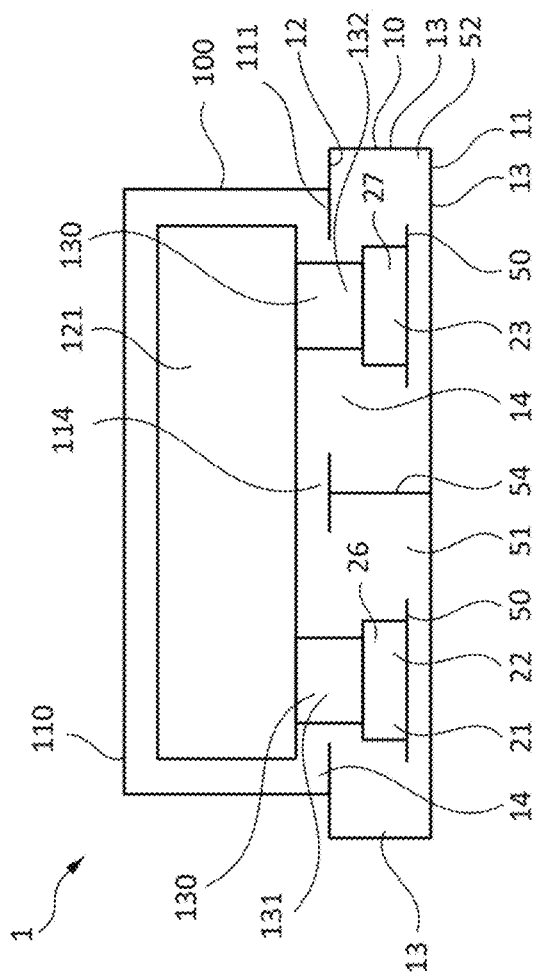
FIG. 13 shows a cross-section of a control-cabinet system with a base module and functional modules.

FIG. 13 shows a cross-section through the control-cabinet system 1 of FIG. 12 at the sectional plane marked A. The base module 10 comprises a housing 11 with a housing face 12 and further housing faces 13. On the housing face 12, the housing 11 has two openings 14. A partition 54 is arranged within the housing 11, wherein two channels, i.e. a first channel 51 and a second channel 52 are separated from each other by means of the partition 54. In the first channel 51, a circuit board 50 configured as a data and extra-low voltage circuit board 48 is arranged with a first connection element 26, wherein the first connection element 26 provides a data connection 21 and an extra-low voltage connection 22. A circuit card 50 configured as a low voltage circuit card 49 is also arranged in the second channel 52 with a second connection element 27, wherein the second connection element 27 provides a low voltage connection 23. The functional module 100 comprises a module housing 110 having a module housing opening 114 on the module housing face 111. Two module connection elements 130, a first plug-in element 131 and a second plug-in element 132, are guided through the module housing opening 114, analogously to FIG. 5. The first plug-in element 131 engages with the first connection element 26 in the first channel 51, while the second plug-in element 132 engages with the second connection element 27 of the second channel 52. The module circuit board 121 of the functional module is thus connected to the data connection 21, the extra-low voltage connection 22 and the low voltage connection 23.

For example if the functional module 100, in contrast to the embodiment of FIG. 13, does not require low voltage, the second plug-in element 132 may either be omitted or not connected to the module circuit board 121.

As an alternative to the illustration of FIG. 13, the second plug-in element 27 may also be guided through the opening 14 above it and thus also be arranged partially above the housing face 12. The second plug-in element 132 may then be arranged inside the module housing 110.

If the module housing 110 is provided with through holes 150 in analogy to FIG. 10, the housing 11 may have corresponding threaded holes in which an internal thread may serve for a screw connection of the functional module 100 to the base module 10.

Contrary to the depiction in FIGS. 12 and 13, it is not mandatory that the module housing 110 approximately cover the housing 10. If openings 14 remain uncovered after the functional module 100 is attached to the base module 10, a cover may be provided for these openings 14. The module housing 110 may also extend beyond the housing 10.

The housing 11 or the module housing 110 may be embodied as a bar-pressed profile or as a die-cast housing. The housing material may be metals such as aluminum, steel, stainless steel or zinc, wherein the housing 11 or module housing 110 may additionally be provided with a coating. In particular, in the case of a metallic embodiment of the module housing 110, it may be provided that the module housing face 111 is flat. It may be provided that the module housing 110 then comprises further, non-metallic elements which do not necessarily have to be flat, or which may protrude from the module housing 110. Likewise, it may be provided that the housing face 12 is flat.

The housing 11 or the module housing 110 may be comprised of a plurality of individual parts that are connected to one another by means of fastening elements, e.g. screws, or by means of welding or soldering. Furthermore, a seal may be provided between the individual parts in order to make the housing 11 or the module housing 110 inaccessible to liquids and/or contact between the individual parts.

Figure 14:
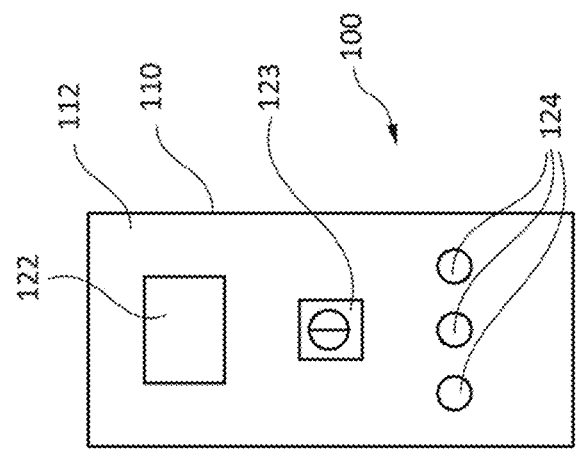
FIG. 14 shows a top view of a further functional module.

FIG. 14 shows a top view of a functional module 100 which may correspond to one of the functional modules 100 described above. The module housing 100 has a display element 122, a closed-loop control element 123, and a plurality of peripheral connection elements 124 on another module housing face 112. The display element 122 may be arranged to display one or more measurement or system values. The control element 123 may be used for a control input. The peripheral connection elements 124 may be used to connect sensors, actuators, motors, or to output a voltage or current. The functional module 100 may have any combination of display element 122, control element 123 and peripheral connection elements 124, in particular display element 122 and/or control element 123 may be omitted or no or a different number of peripheral connection elements 124 may be provided.

Figure 15:
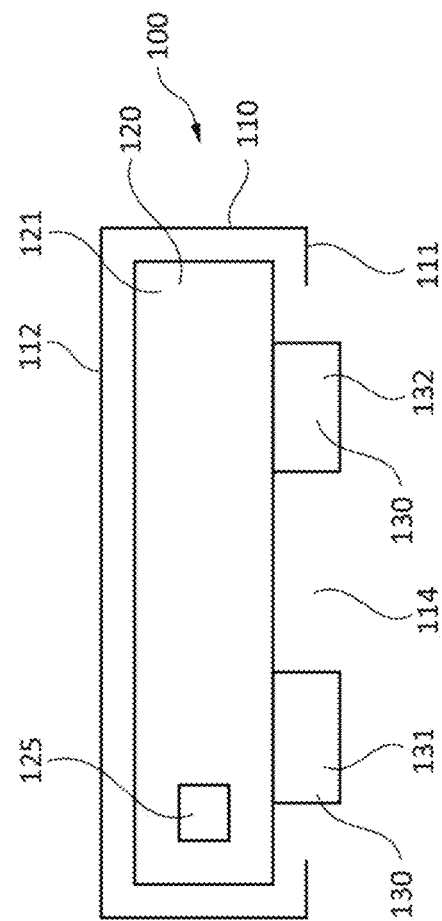
FIG. 15 shows a cross-section through a further functional module.

FIG. 15 shows a cross-sectional view through a functional module 100 corresponding to the functional module 100 of FIG. 5, unless differences are described in the following. A portion of the module housing 110 is arranged on the module housing face 111, and the module housing opening 114 does not cover the entire module housing face 111. In addition, a memory chip 125 is arranged on the module circuit board 121, which may be implemented as an EEPROM ("electrically erasable programmable read-only memory"). The memory chip 125 may store information about which type of functional module 100 the functional module 100 is and which communication is possible with the functional module 100 via the field bus. This information may be stored on the memory chip 125 even if the functional module 100 is not connected to a base module. This makes it possible to plug in or to remove the functional module 100 from the base module during operation without having to interrupt the operation of the system comprising the base module and other functional modules. This e.g. allows for a tripped fuse in the functional module 100 to be replaced by removing the corresponding functional module 100 from the base module and then reattaching it to the base module after replacing the fuse. The memory chip 125 allows the functional module to be reintegrated into the field bus after reattachment.

Figure 16:
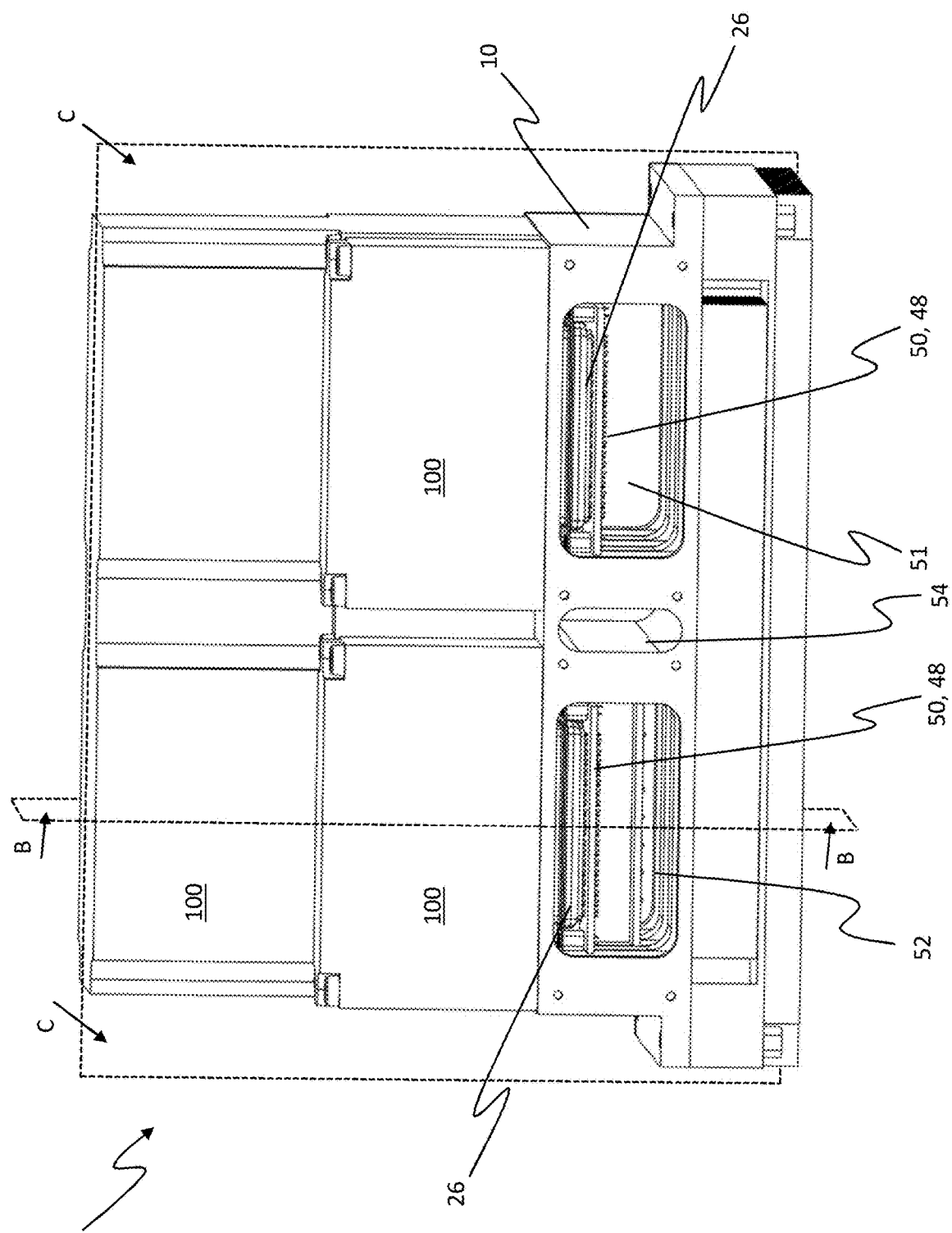
FIG. 16 shows a cross-section through a further control-cabinet system with a base module and a plurality of functional modules.

FIG. 16 shows a cross-section through another control-cabinet system 1, with a base module 10 and three functional modules 100. The base module 10 corresponds to the base module 10 of FIG. 13, unless differences are described in the following. A sectional plane of the cross-section is thereby arranged outside of the functional modules 100, so that only the base module 10 is open in cross-section. The base module 10 has two channels, i.e. a first channel 51 and a second channel 52. In both the first channel 51 and the second channel 52, the base module 10 comprises a data and extra-low voltage conductor card 48 and a respective first connection element 26 arranged on the data and extra-low voltage conductor card 48. The functional modules 100 located directly after the sectional plane engage with the first connection elements 26, respectively, and cover the first channel 51 or the second channel 52, respectively. Elsewhere, a low-voltage conductor card may be provided in the second channel 52, which may be configured as described in FIG. 13. Behind the functional modules 100 arranged directly after the sectional plane, a functional module 100 is arranged covering the first channel 51 and the second channel 52.

Figure 17:
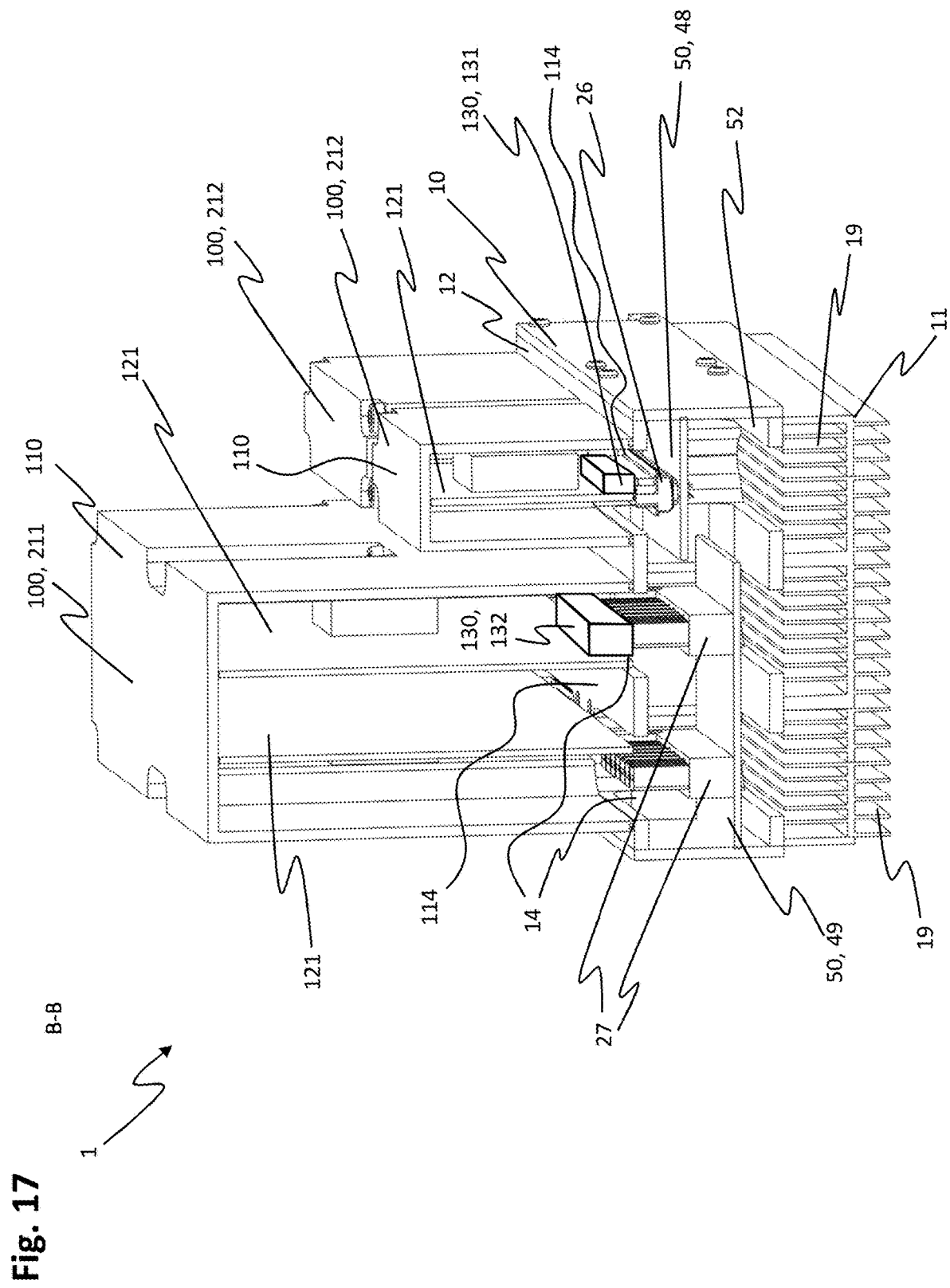
FIG. 17 shows a further cross-section through the further control-cabinet system.

FIG. 17 shows a cross-section through the control-cabinet system 1 of FIG. 16 at the sectional plane marked B. Module circuit boards 121 of a first functional module 211 have an electronic circuit that requires low voltage. Consequently, in the region of the first functional module 211, a module connection element 130 configured as a second plug-in element 132 engages with a second connection element 27 of the base module 10. The second connection element 27 is thereby arranged on a circuit board 50 embodied as a low-voltage circuit board 49. The electronic circuitry incorporated in a second functional module 212 on a module circuit board 121 does not require low voltage. Furthermore, the second functional module 212 is arranged only above the second channel 52. The second functional module 212 comprises a first plug-in element 131 that engages a first connection element 26 of the data and low voltage circuit board 48 already shown in FIG. 16.

Also shown in FIG. 17 are cooling elements 19 which are arranged on the housing 11 of the base module 10 in the form of cooling ribs and enable heat exchange with the environment.

The module circuit boards 121 are arranged perpendicular to the first housing face 12. However, other arrangements of the module circuit boards 121 are possible, as well. The data and extra-low voltage printed circuit board 48 and the low-voltage printed circuit board 49 are each arranged in parallel to the first housing face 12.

In this regard, the first connection element 26 of the data and extra-low voltage conductor card 48 is arranged within the housing 11 of the base module 10. The first plug-in element 131 is guided through the module housing opening 114 from the inside of the module housing 110 to the outside of the module housing 110. The second connection elements 27 are arranged within the housing 11 of the base module 10, as well. The second plug-in element 132 is guided analogously to the first plug-in element 131 through the module housing opening 114 from the inside of the module housing 110 to the outside of the module housing 110.

In an alternative embodiment, the second connection elements 27 of the low-voltage conductor card 49 may be guided through an opening 14 of the housing 11 of the base module 10 and project beyond the housing face 12. The second connection element 132 may then be disposed within the module housing 110 or may likewise extend through the module housing opening 114 from the interior of the module housing 110 to the exterior of the module housing 110 in a manner analogous to the first plug-in element 131.

Figure 18:
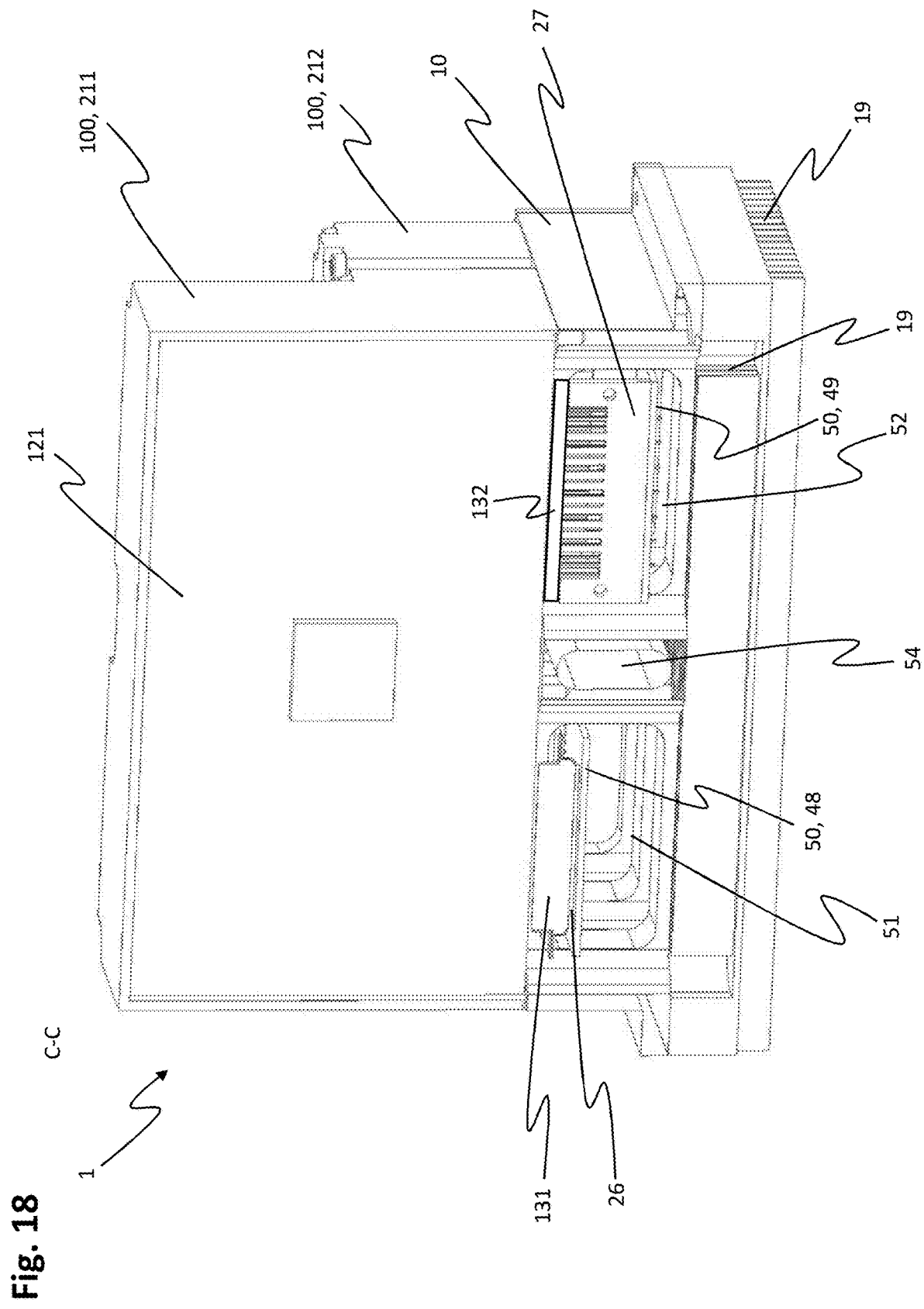
FIG. 18 shows a further cross-section through the further control-cabinet system.

FIG. 18 shows a cross-section through the control-cabinet system 1 of FIG. 16 at the sectional plane marked C. A first plug-in element 131 engages in the first connection element 26. The second plug-in element 132 shown in FIG. 17 is used to engage with the second connection element 27.

Thus, in FIGS. 16 to 18, a control-cabinet system 1 is shown which has, in the second channel 52, both first connection elements 26 on a data and extra-low voltage conductor card 48 and second connection elements 27 on a low-voltage conductor card 49.

The first connecting elements 26 may be configured to form counterparts to the first plug-in element 131 shown in FIGS. 6A and 6B.

Figure 19:
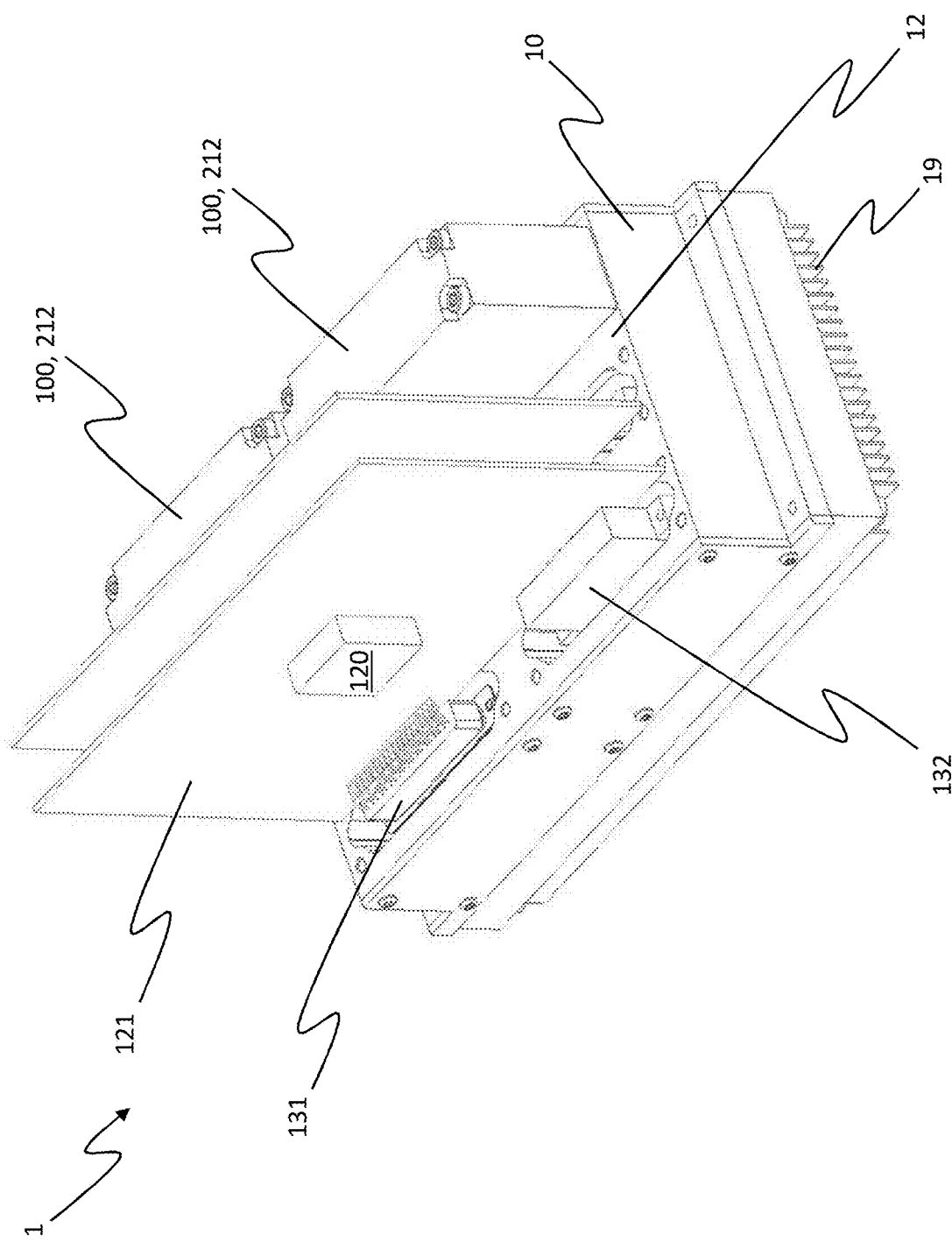
FIG. 19 shows a view of the further control-cabinet system.

FIG. 19 shows a rotated isometric view of the control-cabinet system 1 of FIGS. 16 to 18, wherein the module housing of the first functional module has been removed. The electronic circuit 120 on the module circuit board 121 comprises a first plug-in element 131 for engaging the first connection element and a second plug-in element 132 for engaging the second connection element. The connection elements are thereby covered by the first plug-in element 131 and the second plug-in element 132, respectively. The module circuit board 121 is arranged perpendicular to the first housing face 12. However, other arrangements of the module circuit boards 121 are possible, as well. The first functional module has two module circuit boards 121, however, another number of module circuit boards 121 is conceivable.

Figure 20:
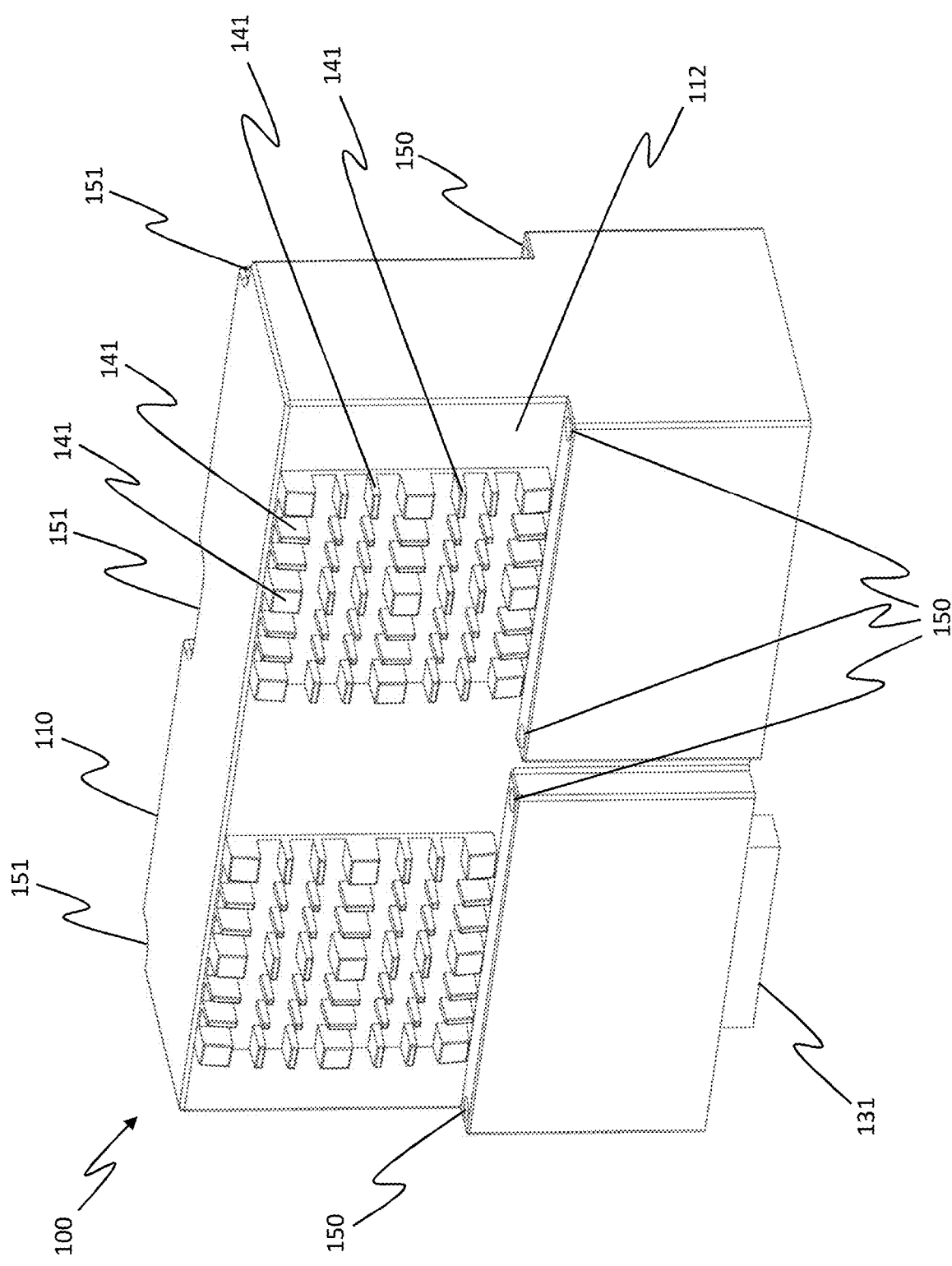
FIG. 20 shows a module housing.

FIG. 20 shows an isometric view of a functional module 100 with rod heat sinks 141. The functional module 100 comprises a first plug-in element 131 which may be used to connect the functional module 131 to a base module. The rod heat sinks 141 are arranged on another module housing face 112. Furthermore, the module housing 110 has through holes 150 and recesses 151 analogous to FIG. 10 that may be used to attach the functional module 100 to a base module using screws.

Figure 21:
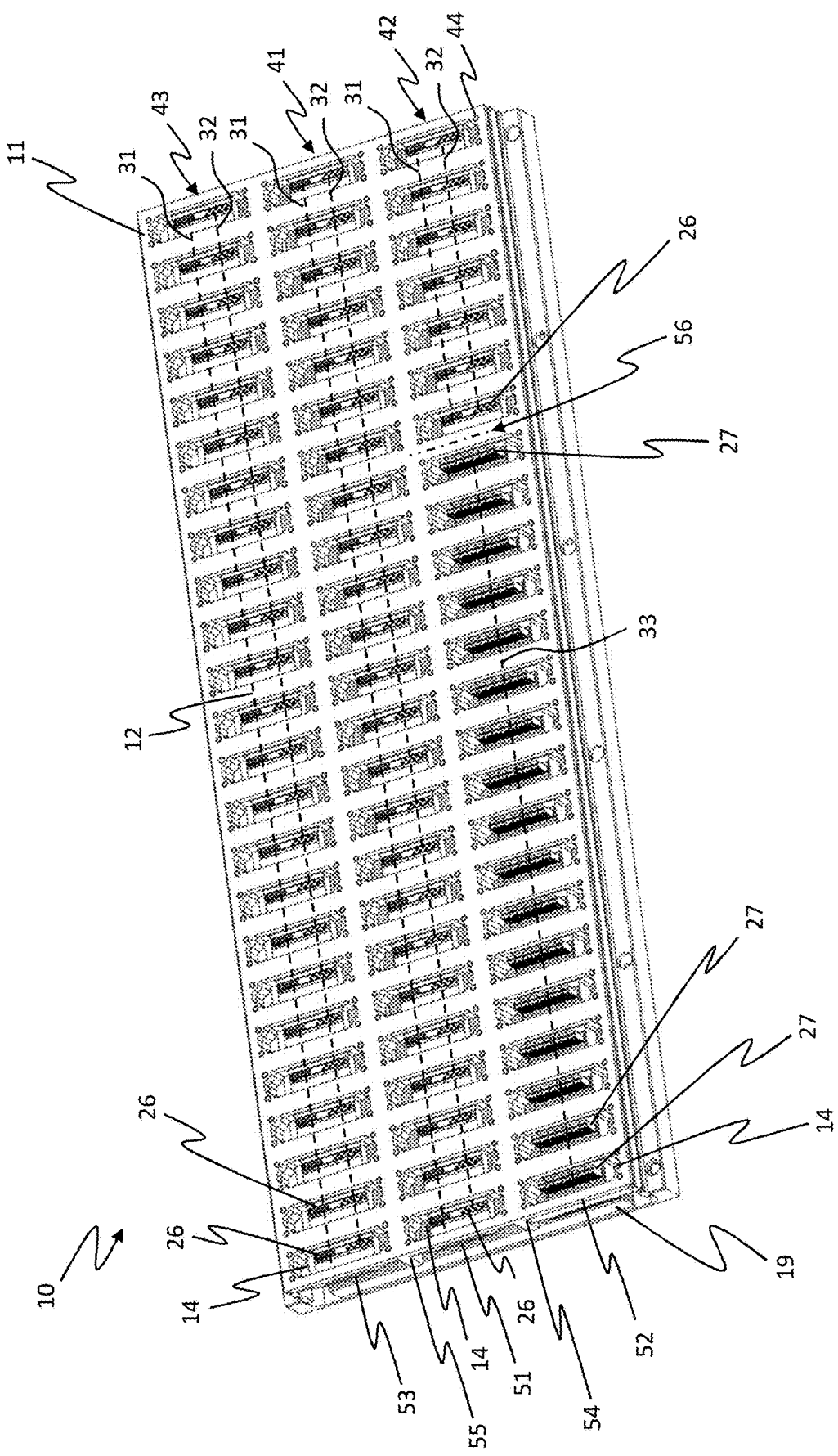
FIG. 21 shows an isometric view of a further base module.

FIG. 21 shows an isometric view of a base module 10 for a control-cabinet system. The base module 10 has a first row 41, a second row 42, and a third row 43 of openings 14. The first row 41 is associated with a first channel 51 inside of a housing 11 of the base module 10. The second row 42 is associated with a second channel 52 inside of the housing 11. The third row 43 is associated with a third channel 53 inside of the housing 11. The first row 41 of openings 14 is arranged centrally, and the second row 42 and the third row 43 of openings 14 are arranged on opposite sides of the first row 41. Thus, the first channel 51 is also centrally disposed, between the second channel 52 and the third channel 53. A first partition 54 and a second partition 55 are adjacent to the first channel 51, the first partition 54 separating the first channel 51 from the second channel 52 and the second partition 55 separating the first channel 51 from the third channel 53.

First connection elements 26 are arranged in the first channel 51 and in the third channel 53. Second connection elements 27 are arranged in the second channel 52. However, it is not provided that all openings 14 of the second row 42 are each assigned a second connection element 27. The second connection elements 27 are arranged in the second channel 52 only up to a boundary 56. The boundary is illustrated in FIG. 21 by means of a dash-dot line. In the area of the remaining openings 14 of the second row 42, first connection elements 26 are arranged in the second channel 52 analogously to the first channel 51. With such an arrangement, different demands to a control-cabinet system comprising base module 10 and functional modules 100 may be met, while at the same time better utilization of the slots for functional modules provided by the base module 10 may be realized. The second connection elements 27 are connected to a low-voltage line 33 shown in dashed lines. The first connection elements are connected to a data line 31 which is also shown in dashed form, and to an extra-low voltage line 22 which is shown in dashed form.

In addition, it may be provided that cooling air is guided through the third channel 53. Alternatively or additionally, the first channel 51 and/or the second channel 52 may also be used to guide cooling air.

Cooling elements 19 are arranged below the first to third channels 51, 52, 53. These are embodied as cooling ribs, but may also have a different shape. The cooling elements 19 may be arranged to dissipate heat from inside of the housing 11 to the surroundings. Threaded holes 44 are arranged around the openings 14, which may serve to fasten functional modules to the base module 10. The threaded holes 44 may be embodied as blind holes.

The data line 31 may be configured to provide a field bus across all of the first connection elements 26.

The first connection elements 26 may be arranged below the openings 14. The second connection elements 27 may be arranged below the openings 14, as well. Alternatively, the second connection elements 27 may be guided through the openings 14 and thus also be arranged partially above the first face 12.

Figure 22:
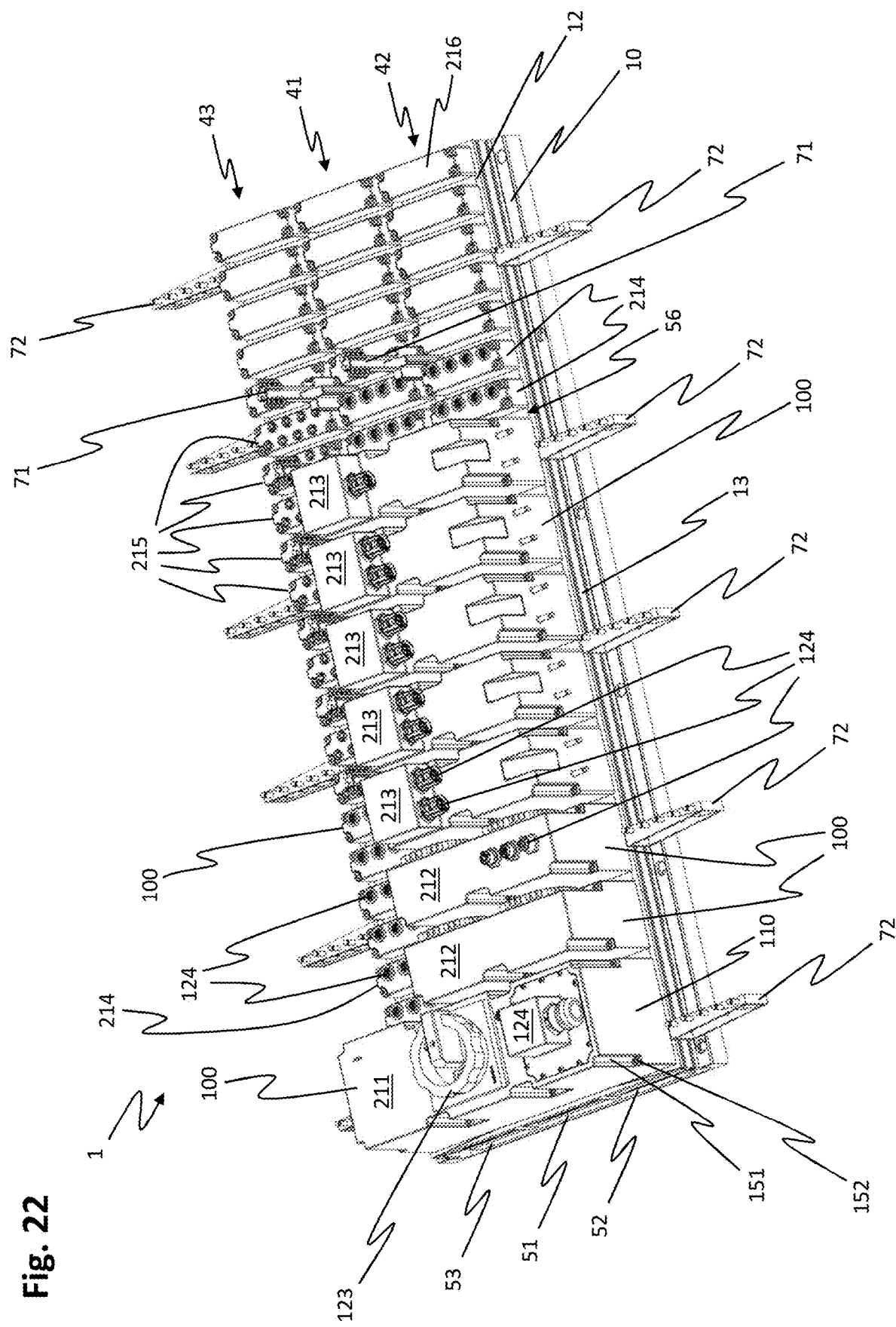
FIG. 22 shows an isometric view of a further control-cabinet system.

FIG. 22 shows a control-cabinet system 1 including the base module 10 of FIG. 21 as well as a plurality of functional modules 100. The functional modules 100 are of different sizes and cover a different number of openings. Furthermore, covers 216 are arranged above the openings without functional modules 100. The functional modules 100 may be connected to the base module 10 as shown in FIGS. 13 and 16 to 19, respectively.

Up to the boundary 56 in the areas where low-voltage connections are arranged in the second channel 52, the functional modules 100 cover both the first channel 51 and the second channel 52. A first functional module 211 in this area also covers the third channel 53, while second functional modules 212 and third functional modules 213 only cover the first channel 51 and the second channel 52. Fourth functional modules 214 and fifth functional modules 215 each cover only one of the first to third channels 51, 52, 53, with the third channel 53 being covered only by fourth functional modules 214 and fifth functional modules 215 except by the first functional module 211. The first channel 51 and the second channel 52 are covered by the fourth functional modules 214 from the boundary 56 onwards, i.e. in areas where first connection elements are arranged in the second channel 52. As a result, at least one first connection element is available for each functional module 100, wherein all functional modules 100 may be connected to the data line of the base module 10.

The first functional module 211 has both a control element 123 and a peripheral connection element 124. The further second to fifth functional modules 212, 213, 214, 215 have no control elements 123 and only partial peripheral connection elements 124. By means of screws 152 which are arranged in recesses 151 of the module housings 110, the functional modules 100 are fastened to the base module 10. The screws 152 engage in the threaded holes 44 shown in FIG. 21.

First cable guiding elements 71 are arranged on the first housing face 12 of the base module 10, which serve to guide cables connected to the peripheral connection elements 124 in an orderly manner. Second cable guiding elements 72 are arranged on further housing faces 13, which also serve for the orderly routing of cables connected to the peripheral connection elements 124.

Since all openings of the base module 10 are closed by means of the functional modules 100 or the cover 216, the control-cabinet system 1 is embodied to be liquid-tight and dust-tight.

Figure 23:
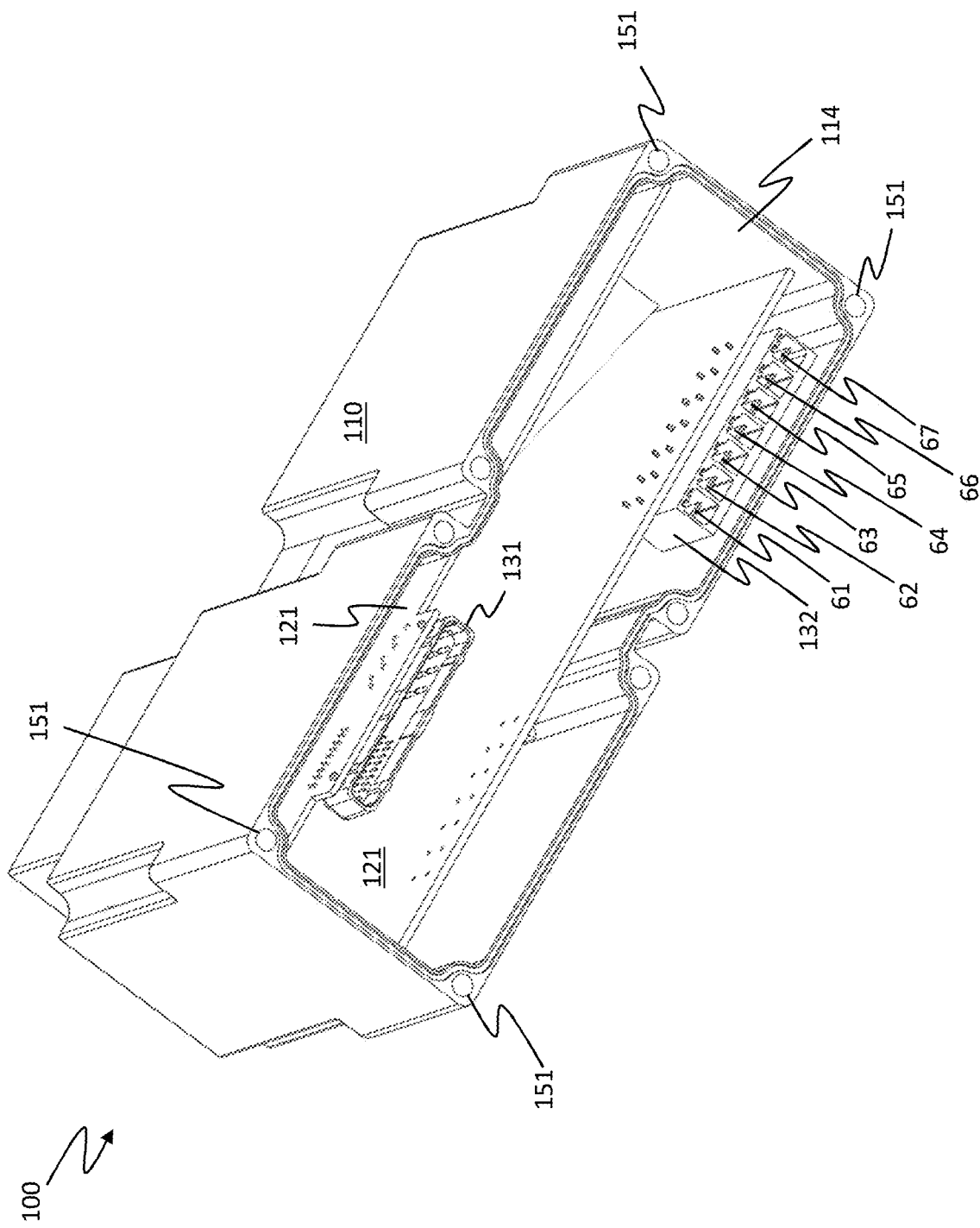
FIG. 23 shows an isometric view of a further functional module.

FIG. 23 shows an isometric view from below of a functional module 100 corresponding to the first functional module 211 of FIGS. 16 to 19, unless differences are described in the following. The first plug-in element 131 is configured as shown in FIGS. 6A and 6B. The second plug-in element 132 has a first contact 61, a second contact 62, and a third contact 63 for an alternating current phase of a three-phase alternating current, respectively. Furthermore, a second plug-in element 132 has a fourth contact 64 for an AC neutral conductor, a fifth contact 65 for a protective conductor, and a sixth contact 66 and a seventh contact 67 for a DC voltage. Depending on the voltage supply required by the functional module 100, the second plug-in element 132 may comprise the first contact 61, the second contact 62, the third contact 63, the fourth contact 64, and the fifth contact 65 if a three-phase AC voltage is required by the functional module 100. If only one phase of AC voltage is required, only the first contact 61 or the second contact 62 or the third contact 63 may be provided in the second plug-in element 132 in addition to the fourth contact 64 and the fifth contact 65. If the functional module 100 requires a DC voltage, the second plug-in element 132 may include the fifth contact 65, the sixth contact 66, and the seventh contact 67. If both DC voltage and AC voltage are required by the functional module 100, the corresponding contacts may be provided, specifically all of the first through seventh contacts 61, 62, 63, 64, 65, 66, 67 if all three AC phases are used, or the fourth contact 64, the fifth contact 65, the sixth contact 66, the seventh contact 67, and in the first contact 61 or the second contact 62 or the third contact 63 if only one of the three AC phases is used.

The arrangement of the first plug-in contacts 171 and second plug-in contacts 172 of the first plug-in element 131 and the first to seventh contacts 61, 62, 63, 64, 65, 66, 67 of the second plug-in element 132 shown in FIGS. 6 and 23 may also be arranged differently.

Figure 24:
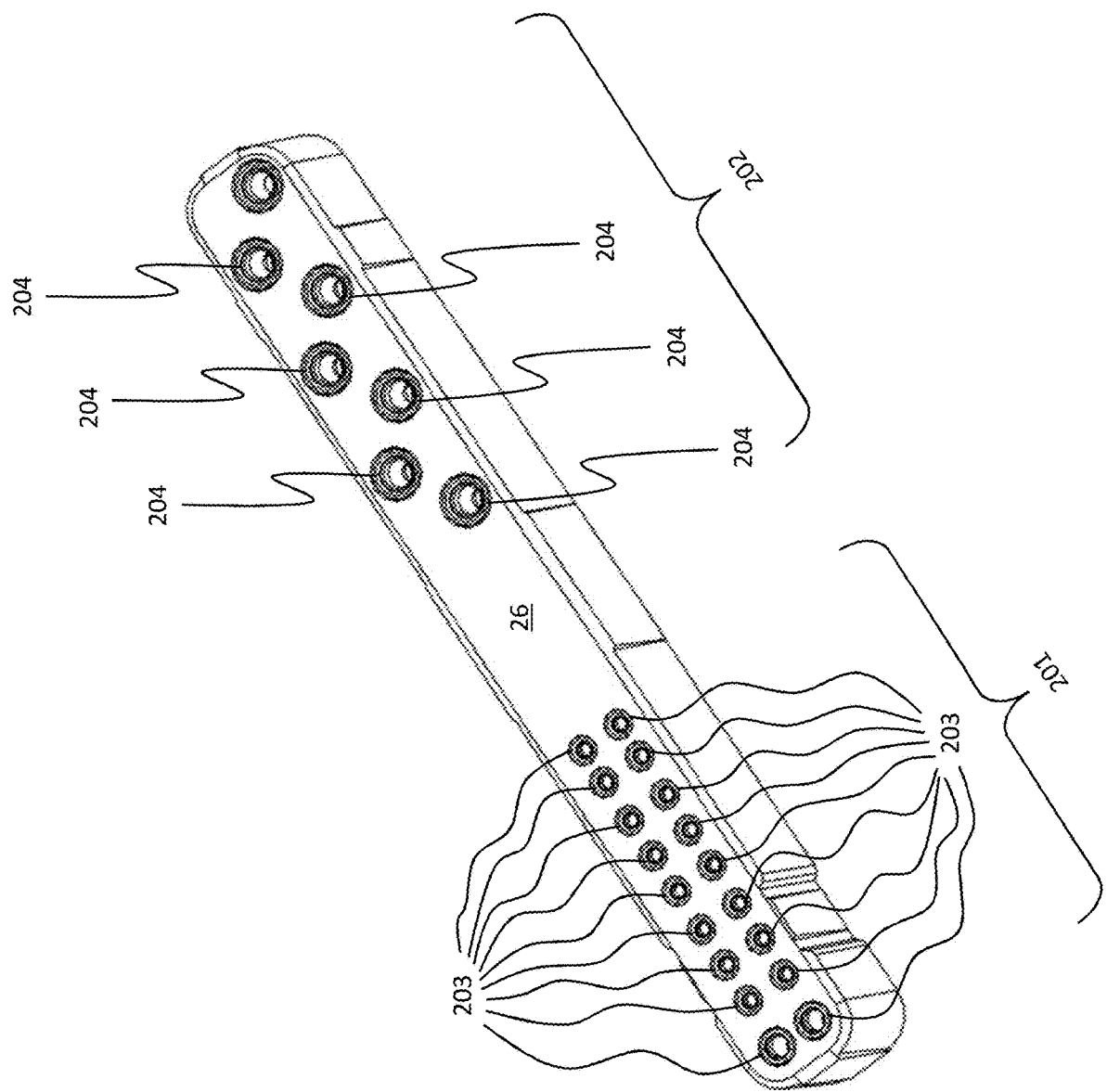
FIG. 24 shows a first connection element.

FIG. 24 shows an isometric view of a first connection element 26. The first connection element 26 shown in FIGS. 13, 16 to 19 and 21 as well as 22 may be embodied, for example, as shown in FIG. 24. The first connection element 26 is configured in such a way that the first plug-in element 131 of FIGS. 6 and 23 may be inserted into the first connection element 26. In a third portion 201, the first connection element 26 has third plug-in contacts 203 that are arranged to correspond to the first plug-in contacts 171 of the first plug-in element 131. In a fourth portion 202, the first connection element 26 has fourth plug-in contacts 204 that are arranged to correspond to the second plug-in contacts 172 of the first plug-in element 131. The third plug-in contacts 203 thus serve to transmit data, while the fourth plug-in contacts 204 serve to transmit extra-low voltage.

TABLE 1

List of reference numerals: 1-125

1 system
2 joint housing
3 intermediate space
10 base module
11 housing
12 housing face
13 further housing face
14 opening
21 data connection
22 extra-low voltage connection
23 low voltage connection
26 first connection element
27 second connection element
31 data line
32 extra-low voltage line
33 low voltage line
44 threaded hole
48 data and extra-low voltage circuit board
49 low voltage circuit board
50 circuit board
51 first channel
52 second channel
54 partition
61 first contact
62 second contact
63 third contact
64 fourth contact
65 fifth contact
66 sixth contact
67 seventh contact
100 functional module
110 module housing
111 module housing face
112 further module housing face
114 module housing opening
115 projection
116 guide groove
117 cover
118 fastening means
120 electronic circuit
121 module circuit board
122 display element
123 (closed-loop) control element
124 peripheral connection element
125 memory chip

TABLE 2

List of reference numerals: 130-216

130 module connection element
131 first plug-in element
132 second plug-in element TABLE 2-continued List of reference numerals: 130-216

133 connector
134 protective housing
141 rod heat sink
142 extruded heat sink
143 partial area
150 through hole
151 recess
160 fuse
168 first portion
163 second portion
171 first plug-in contact
172 second plug-in contact
173 first communication voltage contact
174 second communication voltage contact
175 first communication channel
176 second communication channel
181 first data connection element
182 second data connection element
183 third data connection element
184 fourth data connection element
185 fifth data connection element
186 sixth data connection element
191 first DC voltage contact
192 second DC voltage contact
193 third DC voltage contact
194 fourth DC voltage contact
195 fifth DC voltage contact
196 sixth DC voltage contact
197 protective conductor contact
201 third portion
202 fourth portion
203 third plug-in contacts
204 fourth plug-in contacts
201 third portion
211 first functional module
212 second functional module
213 third functional module
214 fourth function module
215 fifth functional module
216 cover

The invention claimed is:

1. A control-cabinet system comprising:
a base module, and
a plurality of functional modules,
the base module having a housing with a housing face and openings of the housing face, first connection elements and second connection elements, the first connection elements providing data connections and extra-low voltage connections, and the second connection elements providing low voltage connections;
said first connection elements being arranged within said housing in the area of the openings,
said data connections being connected to a data line, and said extra-low voltage connections being connected to an extra-low voltage line,
wherein the low voltage connections are connected to a low voltage line,
wherein the functional modules each comprise a module housing, an electronic circuit and a module connection element,
wherein the module connection element is connected to the electronic circuit, and
wherein the module housing has a module housing face, the module housing face having a module housing opening, the module connection element comprising a first plug-in element, the first plug-in element extending through the module housing opening from inside of the module housing to the outside of the module housing and configured to engage with the first connection elements of the base module.

2. The control-cabinet system according to claim 1, wherein
in at least one functional module the module connection element comprises a second plug-in element, and
wherein the second plug-in element is arranged to engage with the second connection elements of the base module.

3. The control-cabinet system according to claim 2, wherein
the second connection elements extend from the inside of the housing through one of the openings to the outside of the housing, and
wherein the second plug-in element is arranged inside of the module housing.

4. The control-cabinet system according to claim 2, wherein
the second connection elements extend from the inside of the housing through one of the openings to the outside of the housing, and
wherein the second plug-in element extends through the module housing opening from the inside of the module housing to the outside of the module housing.

5. The control-cabinet system according to claim 1, wherein
the first plug-in element is divided up into at least a first portion and a second portion, wherein first plug-in contacts for transmitting data are arranged in the first portion and second plug-in contacts for transmitting extra-low voltage are arranged in the second portion,
wherein the first connection element is divided up into at least a third portion and a fourth portion, wherein third plug-in contacts for transmitting data are arranged in the third portion and fourth plug-in contacts for transmitting extra-low voltage are arranged in the fourth portion, and
wherein the first plug-in contacts are connected to the third plug-in contacts and the second plug-in contacts are connected to the fourth plug-in contacts.

6. The control-cabinet system according to claim 5, wherein the first plug-in contacts and the third plug-in contacts, respectively, comprise at least a first communication voltage contact, a second communication voltage contact, a first data connection, a second data connection, a third data connection, a fourth data connection, a fifth data connection, and a sixth data connection.

7. The control-cabinet system according to claim 5, wherein the second plug-in contacts and the fourth plug-in contacts respectively comprise at least a first DC contact, a second DC contact, a third DC contact, a fourth DC contact, a fifth DC contact, a sixth DC contact, and a protective conductor contact.

8. The control-cabinet system according to claim 1, wherein the module housing is accessible through the module housing opening.

9. The control-cabinet system according to claim 1, wherein the control-cabinet system is configured to be liquid-tight and dust-tight.

10. A functional module comprising:
a module housing,
an electronic circuit, and
a module connection element;
the module connection element being connected to the electronic circuit, and the module housing having a module housing face, the module housing face having a module housing opening;
wherein the module connection element comprises a first plug-in element, the first plug-in element extending through the module housing opening from inside of the module housing to the outside of the module housing and configured to engage a first plug-in element of a base module.

11. The functional module according to claim 10, wherein
the first plug-in element is divided up at least into a first portion for transmitting data and a second portion for transmitting extra-low voltage, and
wherein first plug-in contacts are arranged in the first portion and second plug-in contacts are arranged in the second portion.

12. The functional module according to claim 11, wherein the first plug-in contacts comprise at least a first communication voltage contact, a second communication voltage contact, a first data connection element, a second data connection element, a third data connection element, a fourth data connection element, a fifth data connection element, and a sixth data connection element.

13. The functional module according to claim 11, wherein the second plug-in contacts comprise at least a first DC contact, a second DC contact, a third DC contact, a fourth DC contact, a fifth DC contact, a sixth DC contact, and a protective conductor contact.

14. The functional module according to claim 11, the module connection element comprising a second plug-in element, wherein the second plug-in element is configured to engage a second plug-in element of the base module.

15. The functional module according to claim 14, wherein the second plug-in element is arranged inside of the module housing.

16. The functional module according to claim 10, wherein the module housing comprises a metal, wherein the metal comprises aluminum and/or zinc.

17. The functional module according to claim 16, wherein the second plug-in element extends through the module housing opening from the inside of the module housing to the outside of the module housing.

18. The functional module according to claim 10, wherein the module housing comprises a bar extrusion or a die cast housing.

19. The functional module according to claim 10, further comprising a fuse, wherein the fuse is arranged between the module connection element and the electronic circuit.

20. The functional module according to claim 10, wherein the module housing is accessible through the module housing opening.

* * * * *